US010560056B2

(12) United States Patent
Takahashi et al.

(10) Patent No.: US 10,560,056 B2
(45) Date of Patent: *Feb. 11, 2020

(54) SEMICONDUCTOR DEVICE

(71) Applicant: Semiconductor Energy Laboratory Co., Ltd., Atusgi-shi, Kanagawa-ken (JP)

(72) Inventors: Kei Takahashi, Kanagawa (JP); Yoshifumi Tanada, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/679,203

(22) Filed: Aug. 17, 2017

(65) Prior Publication Data

US 2018/0102741 A1    Apr. 12, 2018

Related U.S. Application Data

(63) Continuation of application No. 13/802,945, filed on Mar. 14, 2013, now Pat. No. 9,742,356.

(30) Foreign Application Priority Data

Apr. 11, 2012    (JP) ................................. 2012-090058

(51) Int. Cl.
*H03F 1/02*    (2006.01)
*H03F 3/45*    (2006.01)
(Continued)

(52) U.S. Cl.
CPC ............ *H03F 1/0211* (2013.01); *G05F 1/468* (2013.01); *G05F 1/56* (2013.01); *H03F 1/0261* (2013.01);
(Continued)

(58) Field of Classification Search
CPC .... H02M 3/156; H02M 3/1563; H02M 3/158; H02M 3/1588; H02M 2001/0025;
(Continued)

(56) References Cited

U.S. PATENT DOCUMENTS

| 4,553,098 A | 11/1985 | Yoh et al. |
| 4,559,694 A | 12/1985 | Yoh et al. |

(Continued)

FOREIGN PATENT DOCUMENTS

| EP | 1737044 A | 12/2006 |
| EP | 2226847 A | 9/2010 |

(Continued)

OTHER PUBLICATIONS

English translation of JP2007318655.*

(Continued)

*Primary Examiner* — Gary L Laxton
*Assistant Examiner* — Carlos O Rivera-Perez
(74) *Attorney, Agent, or Firm* — Fish & Richardson P.C.

(57) ABSTRACT

Power consumption of a signal processing circuit is reduced. Further, power consumption of a semiconductor device including the signal processing circuit is reduced. The signal processing circuit includes a reference voltage generation circuit, a voltage divider circuit, an operational amplifier, a bias circuit for supplying bias current to the operational amplifier, and first and second holding circuits. The first holding circuit is connected between the reference voltage generation circuit and the bias circuit. The second holding circuit is connected between the voltage divider circuit and a non-inverting input terminal of the operational amplifier. Reference voltage from the reference voltage generation circuit and reference voltage from the voltage divider circuit can be held in the first and second holding circuits, respectively, so that the reference voltage generation circuit can (Continued)

stop operating. Thus, power consumption of the reference voltage generation circuit can be reduced.

14 Claims, 11 Drawing Sheets

(51) Int. Cl.
  G05F 1/46 (2006.01)
  G05F 1/56 (2006.01)
  H03F 1/34 (2006.01)
  H02M 3/156 (2006.01)
(52) U.S. Cl.
  CPC ......... *H03F 1/342* (2013.01); *H03F 3/45183* (2013.01); *H02M 3/156* (2013.01); *H03F 2203/45244* (2013.01); *H03F 2203/45506* (2013.01); *H03F 2203/45702* (2013.01)
(58) Field of Classification Search
  CPC . H02M 2001/0032; H02M 2001/0048; H02M 2001/0054; H02M 2001/0045; G05F 1/10; G05F 1/46; G05F 1/461; G05F 1/468; G05F 1/56; G05F 1/565; G05F 1/575; H03F 1/0211; H03F 1/0261; H03F 1/0205; H03F 1/02; H03F 1/34; H03F 1/342; H03F 3/45183; H03F 2203/45244; H03F 2203/45506; H03F 2203/45702
  USPC ........ 323/222–226, 268, 271–276, 280–286, 323/288, 311–317, 351; 330/252–261, 330/291–294; 327/74–89, 538–543
  See application file for complete search history.

(56) References Cited

U.S. PATENT DOCUMENTS

| | | | |
|---|---|---|---|
| 5,159,260 | A | 10/1992 | Yoh et al. |
| 5,384,740 | A | 1/1995 | Etoh et al. |
| 5,455,797 | A | 10/1995 | Etoh et al. |
| 5,731,856 | A | 3/1998 | Kim et al. |
| 5,744,864 | A | 4/1998 | Cillessen et al. |
| 6,114,907 | A | 9/2000 | Sakurai |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,224,208 | B2 | 5/2007 | Matsushita |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,956,686 | B2 | 6/2011 | Yuasa |
| 8,134,355 | B2 | 3/2012 | Inoue et al. |
| 8,344,788 | B2 | 1/2013 | Yamazaki et al. |
| 8,582,349 | B2 | 11/2013 | Yamazaki et al. |
| 8,823,439 | B2 | 9/2014 | Yamazaki et al. |
| 9,136,391 | B2 | 9/2015 | Yamazaki et al. |
| 9,742,356 | B2 * | 8/2017 | Takahashi ............. H03F 1/0261 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0132930 | A1 | 7/2003 | Kimura |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0195020 | A1 | 9/2005 | Matsushita |
| 2005/0199959 | A1 | 9/2005 | Chiang et al. |
| 2005/0274982 | A1 | 12/2005 | Ueda et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0242536 | A1 | 10/2007 | Matsubara |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0007417 | A1 | 1/2010 | Yuasa |
| 2010/0065844 | A1 | 3/2010 | Tokunaga |
| 2010/0085030 | A1 | 4/2010 | Inoue et al. |
| 2010/0092800 | A1 | 4/2010 | Itagaki et al. |
| 2010/0109002 | A1 | 5/2010 | Itagaki et al. |
| 2010/0270997 | A1 | 10/2010 | Riedel |
| 2011/0074508 | A1 | 3/2011 | Imura |

(56) References Cited

U.S. PATENT DOCUMENTS

| | | |
|---|---|---|
| 2011/0181349 A1 | 7/2011 | Yamazaki et al. |
| 2012/0049889 A1 | 3/2012 | Hatano |
| 2012/0140523 A1 | 6/2012 | Takahashi et al. |
| 2013/0207727 A1* | 8/2013 | Kusuda ............... H03F 1/26 330/296 |

FOREIGN PATENT DOCUMENTS

| | | |
|---|---|---|
| JP | 55-039412 A | 3/1980 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-242847 A | 9/1994 |
| JP | 08-264794 A | 10/1996 |
| JP | 09-069014 A | 3/1997 |
| JP | 11-505377 | 5/1999 |
| JP | 2000-044236 A | 2/2000 |
| JP | 2000-150900 A | 5/2000 |
| JP | 2000-183671 A | 6/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-250664 A | 9/2005 |
| JP | 2007-318655 A | 12/2007 |
| JP | 2008-165286 A | 7/2008 |
| JP | 2009-171548 A | 7/2009 |
| JP | 2010-108491 A | 5/2010 |
| JP | 2011-096210 A | 5/2011 |
| JP | 2011-172217 A | 9/2011 |
| JP | 2012-069231 A | 4/2012 |
| WO | WO-2004/114391 | 12/2004 |
| WO | WO-2010/038602 | 4/2010 |
| WO | WO-2011/089841 | 7/2011 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amoprhous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and Sc2O3—A2O3—BO Systems [A; Fe, Ga, or Al; B; Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letter) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, Mar. 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics letter) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

German Office Action (Application No. 102013206284.2) dated Feb. 25, 2019.

* cited by examiner

SEMICONDUCTOR DEVICE

CROSS-REFERENCE TO RELATED APPLICATIONS

This application is a continuation of U.S. application Ser. No. 13/802,945, filed Mar. 14, 2013, now allowed, which claims the benefit of a foreign priority application filed in Japan as Serial No. 2012-090058 on Apr. 11, 2012, both of which are incorporated by reference.

BACKGROUND OF THE INVENTION

1. Field of the Invention

The present invention relates to a semiconductor device. In particular, the present invention relates to a semiconductor device in which supply of power supply voltage to a signal processing circuit can be stopped. In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

In recent years, a reduction in power consumption of an electronic device in operation has been highly required. In order to reduce power consumption of an electronic device, operation of each logic circuit is controlled in accordance with operation of a signal processing circuit.

In a voltage regulator, which is an example of a signal processing circuit, a three-stage structure operation with a high power supply rejection ratio and favorable transient response characteristics and a two-stage structure operation with low current consumption are automatically switched (see Patent Document 1). The three-stage structure includes a first differential amplifier circuit, a second differential amplifier circuit, and an output transistor, and the second-stage structure includes the second differential amplifier circuit and the output transistor.

REFERENCE

Patent Document

[Patent Document 1] Japanese Published Patent Application No. 2011-096210

SUMMARY OF THE INVENTION

However, in the voltage regulator disclosed in Patent Document 1, even in operation with very small current, a reference voltage generation circuit consumes power as long as current is supplied from a power supply to the reference voltage generation circuit. Therefore, it cannot be said that power consumption of the signal processing circuit is sufficiently reduced.

In view of the above problem, an object of an embodiment of the present invention is to reduce power consumption of a signal processing circuit. Further, it is an object to reduce power consumption of a semiconductor device including the signal processing circuit.

A semiconductor device according to an embodiment of the present invention includes a reference voltage generation circuit, a voltage divider circuit, an operational amplifier, a bias circuit for supplying bias current to the operational amplifier, a first holding circuit, and a second holding circuit. The first holding circuit is connected between the reference voltage generation circuit and the bias circuit. The second holding circuit is connected between the voltage divider circuit and a non-inverting input terminal of the operational amplifier.

The first and second holding circuits each include a switch and a capacitor. One end of the switch of the first holding circuit is connected to the reference voltage generation circuit, and the other end of the switch of the first holding circuit is connected to the bias circuit and one of a pair of electrodes of the capacitor of the first holding circuit. One end of the switch of the second holding circuit is connected to the voltage divider circuit, and the other end of the switch of the second holding circuit is connected to the operational amplifier and one of a pair of electrodes of the capacitor of the second holding circuit. A transistor with significantly small off-state current is used as each of the switches.

As the transistor with extremely small off-state current, a transistor whose channel is formed in a film or a substrate including a semiconductor having a wider band gap than silicon can be used. As a semiconductor having a wider band gap than silicon, a compound semiconductor such as an oxide semiconductor or a nitride semiconductor is given. For example, a transistor having a channel in an oxide semiconductor film can be used as the transistor with significantly small off-state current.

Note that in this specification and the like, off-state current is current that flows between a source and a drain when a transistor is in an off state. In an n-channel transistor (e.g., with a threshold voltage of about 0 V to 2 V), the off-state current means current that flows between a source and a drain when negative voltage is applied between a gate and the source.

When a transistor whose channel is formed in an oxide semiconductor film is used as a switch, even in the case where a potential of a node to which the switch and a capacitor are connected is kept constant and then the switch is turned off, the amount of electric charges leaking through the switch can be extremely small.

Therefore, by turning off the switch included in the first holding circuit, voltage output from the reference voltage generation circuit can be held in a node to which the switch and the capacitor of the first holding circuit are connected. Further, by turning off the switch included in the second holding circuit, voltage output from the voltage divider circuit can be held in a node to which the switch and the capacitor of the second holding circuit are connected.

Accordingly, the reference voltage generation circuit does not need to keep outputting voltage to the bias circuit or the operational amplifier, so that the reference voltage generation circuit does not need to continuously operate. Thus, supply of power to the reference voltage generation circuit can be stopped, whereby power consumed by the reference voltage generation circuit can be reduced.

A semiconductor device according to an embodiment of the present invention includes a reference voltage generation circuit which is connected between a first terminal supplied with first power supply voltage and a second terminal supplied with second power supply voltage and outputs first reference voltage and second reference voltage; a voltage divider circuit which is connected between the first terminal and the second terminal and divides the second reference voltage to output reference voltage; a first switch which is connected between the first terminal and the reference voltage generation circuit and is turned on or off in accordance with a first signal; an operational amplifier whose non-inverting input terminal is supplied with the reference voltage from the voltage divider circuit and whose inverting input terminal is supplied with output voltage; a bias circuit which supplies bias current to the operational amplifier; a first holding circuit which is connected between the reference voltage generation circuit and the bias circuit and holds the first reference voltage in accordance with a second signal; and a second holding circuit which is connected between the voltage divider circuit and the non-inverting input terminal of the operational amplifier and holds the reference voltage output from the voltage divider circuit in accordance with the second signal.

A semiconductor device according to an embodiment of the present invention includes a reference voltage generation circuit which is connected between a first terminal supplied with first power supply voltage and a second terminal supplied with second power supply voltage and outputs first reference voltage and second reference voltage; a voltage divider circuit which is connected between the first terminal and the second terminal and divides the second reference voltage to output reference voltage; a first switch which is connected between the first terminal and the reference voltage generation circuit and is turned on or off in accordance with a first signal; an operational amplifier whose non-inverting input terminal is supplied with the reference voltage from the voltage divider circuit and whose inverting input terminal is supplied with output voltage; a bias circuit which is connected between the operational amplifier and the second terminal and supplies bias current to the operational amplifier, a first holding circuit which is connected between the reference voltage generation circuit and the bias circuit and holds the first reference voltage in accordance with a second signal; and a second holding circuit which is connected between the voltage divider circuit and the non-inverting input terminal of the operational amplifier and holds the reference voltage output from the voltage divider circuit in accordance with the second signal.

A semiconductor device according to an embodiment of the present invention includes a reference voltage generation circuit which is connected between a first terminal supplied with first power supply voltage and a second terminal supplied with second power supply voltage and outputs reference voltage; a voltage divider circuit which is connected between the first terminal and the second terminal and divides the reference voltage output from the reference voltage generation circuit to output reference voltage; a first switch which is connected between the first terminal and the reference voltage generation circuit and is turned on or off in accordance with a first signal; an operational amplifier whose non-inverting input terminal is supplied with the reference voltage from the voltage divider circuit and whose inverting input terminal is supplied with output voltage; a bias circuit which is connected between the operational amplifier and the first terminal and supplies bias current to the operational amplifier, a first holding circuit which is connected between the reference voltage generation circuit and the bias circuit and holds the reference voltage output from the reference voltage generation circuit in accordance with a second signal; and a second holding circuit which is connected between the voltage divider circuit and the non-inverting input terminal of the operational amplifier and holds the reference voltage output from the voltage divider circuit in accordance with the second signal.

In each of the semiconductor devices, the first and second holding circuits each include a second switch and a capacitor. The second switch is turned on or off in accordance with the second signal. The second switch is a transistor whose channel is formed in an oxide semiconductor.

A semiconductor device according to an embodiment of the present invention includes a reference voltage generation circuit which is connected between a first terminal supplied with first power supply voltage and a second terminal supplied with second power supply voltage and outputs first reference voltage and second reference voltage; a first switch which is connected between the first terminal and the reference voltage generation circuit and is turned on or off in accordance with a first signal; a voltage divider circuit which is connected between the first terminal and the second terminal and divides the second reference voltage to output reference voltage; an operational amplifier whose non-inverting input terminal is supplied with the reference voltage from the voltage divider circuit and whose inverting input terminal is supplied with output voltage; a first bias circuit which is connected between the operational amplifier and the first terminal and supplies bias current to the operational amplifier; a second bias circuit which is connected between the operational amplifier and the second terminal and supplies bias current to the operational amplifier; a first holding circuit which is connected between the reference voltage generation circuit and the first bias circuit and holds the first reference voltage in accordance with a second signal; a second holding circuit which is connected between the reference voltage generation circuit and the second bias circuit and holds the second reference voltage in accordance with the second signal; and a third holding circuit which is connected between the voltage divider circuit and the non-inverting input terminal of the operational amplifier and holds the reference voltage output from the voltage divider circuit in accordance with the second signal.

In the above semiconductor device, the first to third holding circuits each include a second switch and a capacitor. The second switch is turned on or off in accordance with the second signal. The second switch is a transistor whose channel is formed in an oxide semiconductor.

In each of the semiconductor devices, a channel of the first switch is formed in an oxide semiconductor.

Note that the oxide semiconductor used for the transistors is preferably a purified oxide semiconductor in which impurities serving as electron donors (donors), such as moisture or hydrogen, are reduced and oxygen vacancies are reduced. The purified oxide semiconductor is an i-type (intrinsic) semiconductor or a substantially i-type semiconductor. Therefore, a transistor including the oxide semiconductor has a characteristic of significantly small off-state current. Furthermore, the band gap of the oxide semiconductor is 2 eV or more, preferably 2.5 eV or more, more preferably 3 eV or more. With the use of the oxide semiconductor film which is purified by sufficiently reducing the concentration of impurities such as moisture or hydrogen and by reducing oxygen vacancies, the off-state current of the transistor can be significantly reduced.

Specifically, various experiments can prove small off-state current of a transistor in which a purified oxide semiconductor is used for a semiconductor film. For example, even in an element with a channel width of $1 \times 10^6$ μm and a channel length of 10 μm, in a range from 1 V to 10 V of voltage (drain voltage) between a source terminal and a drain terminal, off-state current can be smaller than or equal to the measurement limit of a semiconductor parameter analyzer, that is, smaller than or equal to $1 \times 10^{-13}$ A. In this case, it can be found that an off-state current density corresponding to a value obtained by dividing the off-state current by the channel width of the transistor is less than or equal to 100 zA/μm. In addition, a capacitor and a transistor were connected to each other and an off-state current density was measured by using a circuit in which electric charge flowing into or from the capacitor was controlled by the transistor. In the measurement, the purified oxide semiconductor film was used for a channel formation region in the transistor, and the off-state current density of the transistor was measured from change in the amount of electric charge of the capacitor per unit time. As a result, it is found that, in the case where the voltage between the source terminal and the drain terminal of the transistor is 3 V, a smaller off-state current density of several tens of yoctoamperes per micrometer (yA/μm) can be obtained. Consequently, it can be said that a transistor whose channel formation region is formed in a purified oxide semiconductor film has much smaller off-state current than a transistor including silicon.

Thus, according to an embodiment of the present invention, power consumption of a signal processing circuit can be sufficiently reduced. Further, power consumption of a semiconductor device including the signal processing circuit can be sufficiently reduced.

DETAILED DESCRIPTION OF THE INVENTION

Hereinafter, embodiments of the present invention will be described in detail with reference to the accompanying drawings. Note that the present invention is not limited to the following description and it is easily understood by those skilled in the art that the modes and details can be variously changed without departing from the scope and spirit of the present invention. Accordingly, the present invention should not be construed as being limited to the description of the embodiments below.

Embodiment 1

In this embodiment, a signal processing circuit according to an embodiment of the present invention will be described with reference to FIG. 1, FIG. 2, and FIG. 3.

Figure 1:
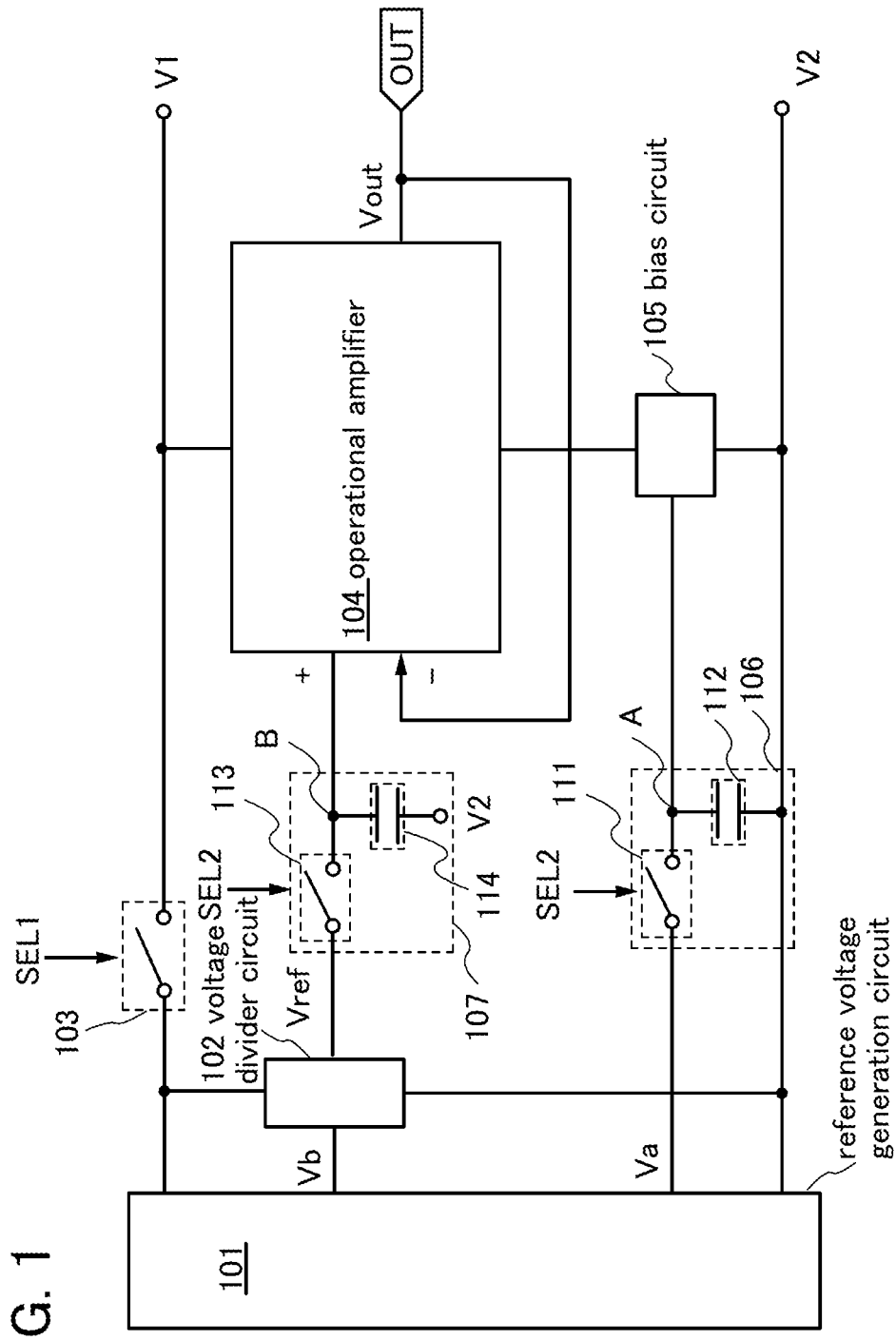
FIG. 1 is a block diagram of a signal processing circuit.

FIG. 1 is a block diagram of a signal processing circuit. The signal processing circuit illustrated in FIG. 1 includes a reference voltage generation circuit 101, a voltage divider circuit 102, a switch 103, an operational amplifier 104, a bias circuit 105, a holding circuit 106, and a holding circuit 107.

The reference voltage generation circuit 101 is connected between a first terminal supplied with first power supply voltage V1 and a second terminal supplied with second power supply voltage V2, and outputs reference voltage Va to the bias circuit 105 and reference voltage Vb to the voltage divider circuit 102. The first power supply voltage V1 is VDD and the second power supply voltage V2 is GND, for example.

The voltage divider circuit 102 is connected between the first terminal and the second terminal, and divides the reference voltage Vb to output reference voltage Vref to a non-inverting input terminal of the operational amplifier 104.

The switch 103 is connected between the first terminal and the reference voltage generation circuit 101, and is turned on or off in accordance with a control signal SEL1. In the case where the switch 103 is in an on state, the first power supply voltage V1 is supplied to the reference voltage generation circuit 101 from the first terminal. In the case where the switch 103 is in an off state, supply of the first power supply voltage V1 to the reference voltage generation circuit 101 from the first terminal is stopped.

In the operational amplifier 104, the reference voltage Vref is input to the non-inverting input terminal and output voltage Vout is output from an output terminal. Further, part of the output voltage Vout is fed back to an inverting input terminal.

The bias circuit 105 is connected between the second terminal and the operational amplifier 104 and supplies bias current to the operational amplifier 104.

The holding circuit 106 is connected between the reference voltage generation circuit 101 and the bias circuit 105. The holding circuit 106 includes a switch 111 and a capacitor 112. One end of the switch 111 is connected to the reference voltage generation circuit 101 and the other end is connected to the bias circuit 105 and one of a pair of electrodes of the capacitor 112. The other of the pair of electrodes of the capacitor 112 is connected to the second terminal. Here, a connection point to which the other end of the switch 111, the one of the pair of electrodes of the capacitor 112, and the bias circuit 105 are connected is a node A.

The switch 111 is turned on or off in accordance with a control signal SEL2. In the case where the switch 111 is in an on state, the reference voltage Va output from the reference voltage generation circuit 101 is supplied to the bias circuit 105. In the case where the switch 111 is in an off state, the reference voltage Va output from the reference voltage generation circuit 101 is held in the node A.

The holding circuit 107 is connected between the voltage divider circuit 102 and the non-inverting input terminal of the operational amplifier 104. The holding circuit 107 includes a switch 113 and a capacitor 114. One end of the switch 113 is connected to the voltage divider circuit 102 and the other end is connected to one of a pair of electrodes of the capacitor 114 and the non-inverting input terminal of the operational amplifier 104. The other of the pair of electrodes of the capacitor 114 is connected to the second terminal. Here, a connection point to which the other end of the switch 113, the one of the pair of electrodes of the capacitor 114, and the non-inverting input terminal of the operational amplifier 104 are connected is a node B.

The switch 113 is turned on or off in accordance with the control signal SEL2. In the case where the switch 113 is in an on state, the reference voltage Vref output from the voltage divider circuit 102 is supplied to the non-inverting input terminal of the operational amplifier 104. In the case where the switch 113 is in an off state, the reference voltage Vref output from the voltage divider circuit 102 is held in the node B.

Figure 2:
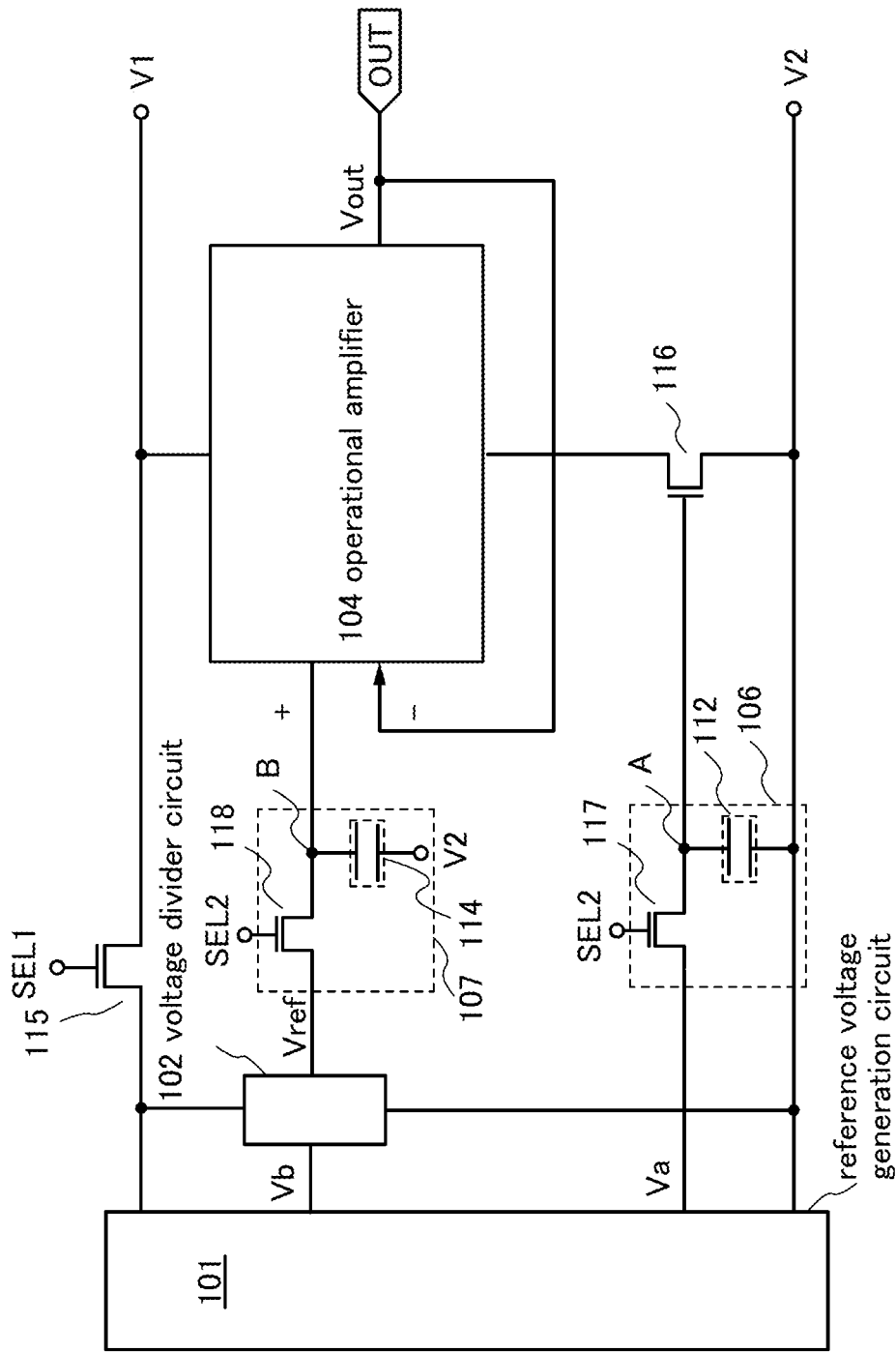
FIG. 2 is a block diagram of a signal processing circuit.

FIG. 2 illustrates examples of the switch 103, the bias circuit 105, the holding circuit 106, and the holding circuit 107 in the signal processing circuit illustrated in FIG. 1.

As the switch 103, for example, a transistor 115 which is turned on or off in accordance with the control signal SEL1 is used.

As the bias circuit 105, for example, a transistor 116 which is turned on or off in accordance with the reference voltage Va output from the reference voltage generation circuit 101 is used. The transistor 116 is turned on when voltage in the node A is higher than or equal to the threshold voltage of the transistor 116. In this case, the bias current is supplied to the operational amplifier 104. The transistor 116 is turned off when the voltage in the node A is lower than the threshold voltage of the transistor 116. In this case, supply of the bias current to the operational amplifier 104 is stopped. Note that the transistor 116 is an n-channel transistor in FIG. 2.

The switch 111 in the holding circuit 106 is, for example, a transistor 117 which is turned on or off in accordance with the control signal SEL2. Here, a transistor with significantly small off-state current is used as the transistor 117.

The switch 113 in the holding circuit 107 is, for example, a transistor 118 which is turned on or off in accordance with the control signal SEL2. Here, a transistor with significantly small off-state current is used as the transistor 118.

As the transistor with significantly small off-state current, a transistor whose channel is formed in a film or a substrate including a semiconductor having a wider band gap than silicon can be used. As a semiconductor having a wider band gap than silicon, a compound semiconductor such as an oxide semiconductor or a nitride semiconductor is given, for example. For example, a transistor having a channel in an oxide semiconductor film can be used as the transistor with extremely small off-state current.

When the transistor 117 with extremely small off-state current is used as the switch 111 in the holding circuit 106 and the transistor 117 is in an off state, voltage of the one of the pair of electrodes of the capacitor 112 can be held for a long time. In other words, in the case where the switch 111 is in an off state, the voltage of the node A in the holding circuit 106 can be held for a long time.

When the transistor 118 with significantly small off-state current is used as the switch 113 in the holding circuit 107 and the transistor 118 is in an off state, voltage of the one of the pair of electrodes of the capacitor 114 can be held for a long time. In other words, in the case where the switch 113 is in an off state, the voltage of the node B in the holding circuit 107 can be held for a long time.

Next, operation of the signal processing circuit illustrated in FIG. 2 is described.

First, the control signal SEL1 is input to the transistor 115 and the transistor 115 is turned on, whereby the first power supply voltage V1 is supplied to the reference voltage generation circuit 101 from the first terminal. In the case where the transistor 115 is an n-channel transistor, a high-level potential may be input as the control signal SEL1, whereas in the case where the transistor 115 is a p-channel transistor, a low-level potential may be input as the control signal SEL1. Note that described below is the case where the transistor 115, the transistor 117, and the transistor 118 are n-channel transistors. The reference voltage generation circuit 101 operates with the first power supply voltage V1 supplied thereto, and outputs the reference voltage Vb to the voltage divider circuit 102 and the reference voltage Va to the holding circuit 106.

The voltage divider circuit 102 outputs the reference voltage Vref obtained by dividing the reference voltage Vb to the holding circuit 107.

The control signal SEL2 is set to a high level and the transistor 117 and the transistor 118 are turned on. When the transistor 117 is turned on, the reference voltage Va output from the reference voltage generation circuit 101 is supplied to the transistor 116. Thus, the transistor 116 is turned on and the second power supply voltage V2 is supplied to the operational amplifier 104 from the second terminal. Further, when the transistor 118 is turned on, the reference voltage Vref output from the voltage divider circuit 102 is output to the non-inverting input terminal of the operational amplifier 104. Thus, the operational amplifier 104 operates: the output voltage Vout is output from the output terminal and part of the output voltage Vout is output to the inverting input terminal of the operational amplifier 104.

After the signal processing circuit illustrated in FIG. 2 reaches a steady state (the state where the reference voltage Va is normally supplied to the bias circuit 105 and the reference voltage Vref is normally supplied to the non-inverting input terminal of the operational amplifier 104), the control signal SEL2 is set to a low level, and thus, the transistor 117 and the transistor 118 are turned off. Since the transistor 117 and the transistor 118 are transistors with significantly small off-state current, the voltage in the node A (reference voltage Va) and the voltage in the node B (reference voltage Vref) can be held for a long time.

Next, the control signal SEL1 is set to a low level and the transistor 115 is turned off. Thus, supply of the first power supply voltage V1 to the reference voltage generation circuit 101 from the first terminal is stopped. Since the first power supply voltage V1 is not supplied to the reference voltage generation circuit 101, the reference voltage generation circuit 101 stops operating.

In the signal processing circuit illustrated in FIG. 2, the transistor 117 with significantly small off-state current is used in the holding circuit 106. Therefore, by turning off the transistor 117, the voltage in the node A (reference voltage Va) can be held for a long time. Thus, even when the reference voltage generation circuit 101 stops operating, the reference voltage Va can still be supplied to the transistor 116. Similarly, the transistor 118 with significantly small off-state current is used in the holding circuit 107. Therefore, by turning off the transistor 118, the voltage in the node B (reference voltage Vref) can be held for a long time. Thus, even when the reference voltage generation circuit 101 stops operating, the reference voltage Vref can still be supplied to the non-inverting input terminal of the operational amplifier 104.

For example, in the case where a transistor including silicon is used as the switch 111, the off-state current thereof is 1 pA. In the case where the capacitance of the capacitor 112 is, for example, 1 pF, the node A holds the reference voltage Va with a change less than 1 mV for only 1 millisecond. Accordingly, when the reference voltage generation circuit 101 stops operating, the bias circuit 105 also stops operating. Therefore, the reference voltage generation circuit 101 cannot stop operating even when the signal processing circuit reaches a steady state.

However, according to an embodiment of the present invention, since the transistor 117 including an oxide semiconductor is used as the switch 111, the off-state current thereof can be 100 yA. When the capacitance of the capacitor 112 is, for example, 1 pF, the node A can hold the reference voltage Va with a change less than 1 mV for $10^7$ seconds (approximately 115 days).

Similarly, since the transistor 118 including an oxide semiconductor is used as the switch 113, the off-state current thereof can be 100 yA. When the capacitance of the capacitor 114 is, for example, 1 pF, the node B can hold the reference voltage Vref with a change less than 1 mV for $10^7$ seconds (approximately 115 days).

Accordingly, the reference voltage generation circuit 101 can stop operating for $10^7$ seconds (approximately 115 days). Before $10^7$ seconds (approximately 115 days) pass, the reference voltage generation circuit 101 may operate and the reference voltage Va and the reference voltage Vref may be output to the holding circuit 106 and the holding circuit 107, respectively, by turning on the switch 103 and supplying the first power supply voltage V1 to the reference voltage generation circuit 101.

In a conventional reference voltage generation circuit, power supply voltage needs to be always supplied while the reference voltage generation circuit outputs voltage. Therefore, power is always consumed by the conventional reference voltage generation circuit.

In contrast, in an embodiment of the present invention, transistors each of whose channels is formed in an oxide semiconductor film are used as the switches 111 and 113. For example, even when the switch 113 is turned off after a potential of the node B to which the switch 113 and the capacitor 114 are connected is kept constant, the amount of electric charges leaking through the switch 113 can be extremely small.

Therefore, when the switch 111 included in the holding circuit 106 is in an off state, the voltage output from the reference voltage generation circuit 101 can be held in the node A to which the switch 111 and the capacitor 112 are connected. Further, when the switch 113 included in the holding circuit 107 is in an off state, the voltage output from the voltage divider circuit 102 can be held in the node B to which the switch 113 and the capacitor 114 are connected.

Accordingly, the reference voltage generation circuit 101 does not need to keep outputting voltage to the bias circuit 105 or the operational amplifier 104, so that the reference voltage generation circuit 101 does not need to continuously operate. Thus, supply of power to the reference voltage generation circuit 101 can be stopped by turning off the switch 103, whereby power consumed by the reference voltage generation circuit 101 can be reduced.

In this embodiment, although the case where the switch 111 and the switch 113 are each a transistor including an oxide semiconductor is described, the switch 103 may be a transistor including an oxide semiconductor.

Further, the switch 103, the switch 111, and the switch 113 may each be a transistor in which upper and lower gates are provided with an oxide semiconductor layer provided therebetween. In the case of the switch 103, the control signal SEL1 can be input to one gate, and a different control signal can be input to the other gate. In the case of the switch 111 and the switch 113, the control signal SEL2 can be input to one gate, and a different control signal can be input to the other gate. The different control signal may be a signal with a fixed potential. The fixed potential may be either a low power supply potential or a high power supply potential. Note that the upper and lower gates may be electrically connected to each other and a control signal may be input. The threshold voltage of the transistor or the like can be controlled by a signal input to the other gate. Further, the off-state current of the transistor can be further reduced.

Although the case where the control signal SEL1 and the control signal SEL2 are different signals is described in this embodiment, the control signal SEL1 and the control signal SEL2 may be the same signal.

In the case where the reference voltage generation circuit 101, the voltage divider circuit 102, and the operational amplifier 104 include transistors, the transistors may each be a transistor whose channel is formed in a layer or a substrate including a semiconductor other than an oxide semiconductor. For example, the transistors can each be a transistor whose channel is formed in a silicon layer or a silicon substrate.

Figure 3:
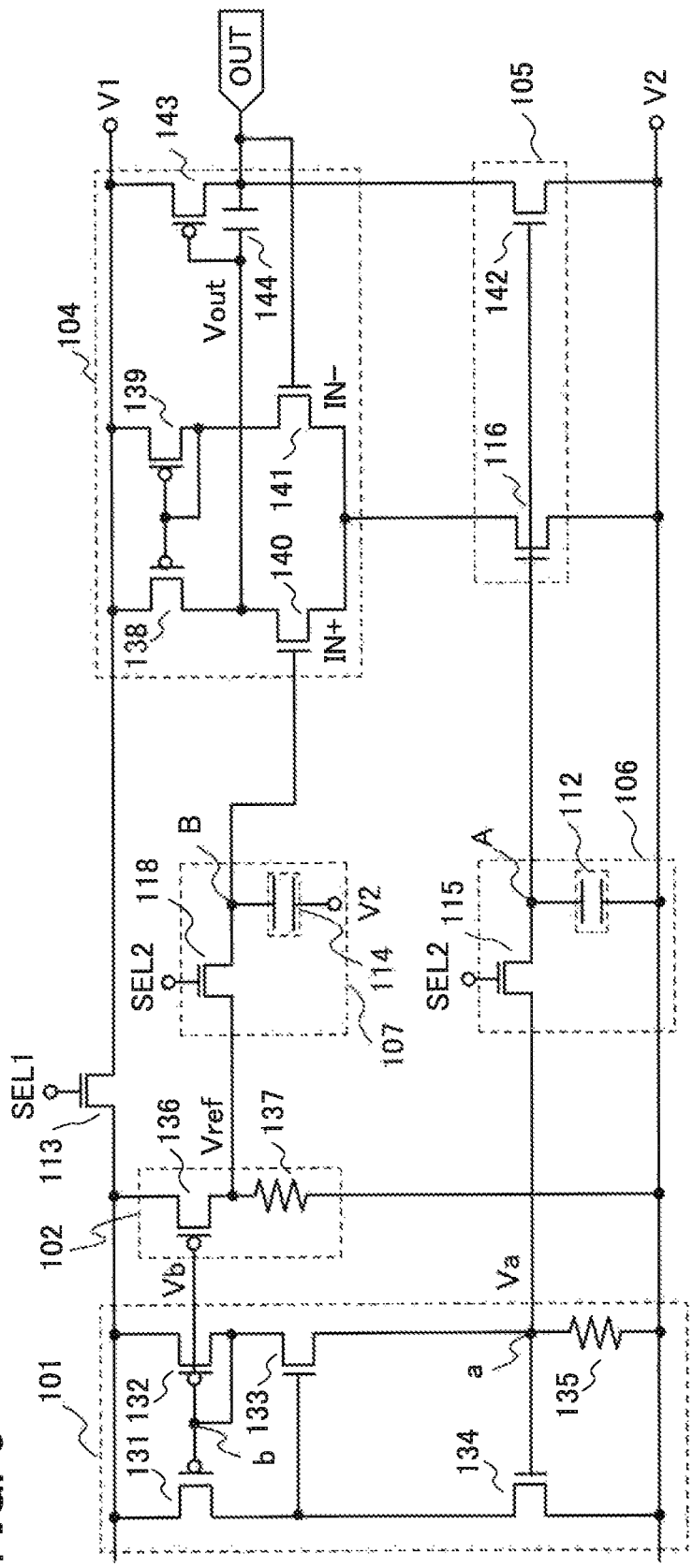
FIG. 3 is a circuit diagram of a signal processing circuit.

FIG. 3 illustrates the signal processing circuit illustrated in FIG. 1 in more detail.

The reference voltage generation circuit 101 includes transistors 131 to 134 and a resistor 135. The transistors 131 and 132 are p-channel transistors, and the transistors 133 and 134 are n-channel transistors. A node a is connected to one of a source and a drain of the transistor 115 in the holding circuit 106, and a node b is connected to a gate of a transistor 136 in the voltage divider circuit 102. The reference voltage Va is voltage in the node a and the reference voltage Vb is voltage in the node b.

The voltage divider circuit 102 includes the transistor 136 and a resistor 137. The transistor 136 is a p-channel transistor. One of a source and a drain of the transistor 136 is connected to one of a source and a drain of the transistor 118 in the holding circuit 107.

The operational amplifier 104 includes transistors 138 to 141, a transistor 143, and a capacitor 144. The transistor 138, the transistor 139, and the transistor 143 are p-channel transistors, and the transistor 138 and the transistor 139 form a current mirror circuit. The transistor 140 and the transistor 141 are n-channel transistors and form a differential circuit. The transistor 143 and the capacitor 144 form a buffer circuit.

Although an example in which a signal processing circuit includes an operational amplifier is described in this embodiment, the signal processing circuit may include a comparator instead of the operational amplifier.

The bias circuit 105 includes the transistor 116 and a transistor 142. The transistor 116 and the transistor 142 are n-channel transistors.

In the signal processing circuit described in this embodiment, the holding circuit 106 is connected between the reference voltage generation circuit 101 and the bias circuit 105, so that the reference voltage Va output from the reference voltage generation circuit 101 can be held in the holding circuit 106. Further, the holding circuit 107 is connected between the voltage divider circuit 102 and the operational amplifier 104, so that the reference voltage Vref output from the voltage divider circuit 102 can be held in the holding circuit 107. Thus, the reference voltage generation circuit 101 can stop operating during a period in which the reference voltage Va is held in the holding circuit 106 and the reference voltage Vref is held in the holding circuit 107, so that power consumed by the reference voltage generation circuit 101 can be reduced. Consequently, power consumed by the signal processing circuit can be reduced.

The signal processing circuit described in this embodiment can be used for, for example, an AC-DC converter, a sensor, or the like. The signal processing circuit described in this embodiment is particularly effectively used in a circuit in which an analog circuit such as an operational amplifier or a comparator is used and a fixed voltage or a signal is continuously output.

This embodiment can be combined with any of the other embodiments as appropriate.

Embodiment 2

In this embodiment, another embodiment of a signal processing circuit according to an embodiment of the present invention will be described with reference to FIG. 4, FIG. 5, and FIG. 6.

Figure 4:
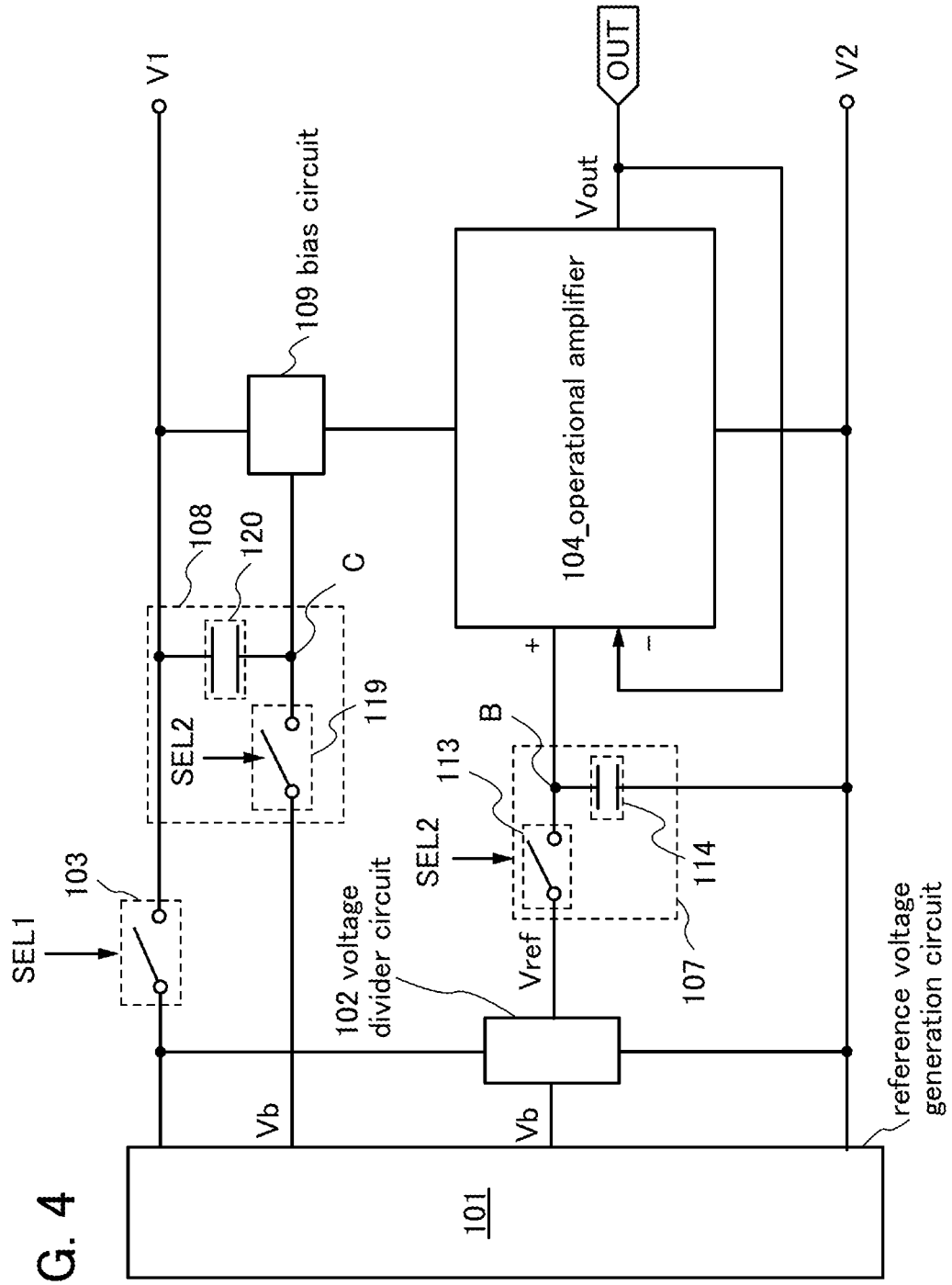
FIG. 4 is a block diagram of a signal processing circuit.

FIG. 4 is a block diagram of a signal processing circuit. The signal processing circuit illustrated in FIG. 4 includes the reference voltage generation circuit 101, the voltage divider circuit 102, the switch 103, the operational amplifier 104, the holding circuit 107, a bias circuit 109, and a holding circuit 108.

The reference voltage generation circuit 101 is connected between the first terminal supplied with the first power supply voltage V1 and the second terminal supplied with the second power supply voltage V2, and outputs the reference voltage Vb to the bias circuit 109 and the voltage divider circuit 102. The first power supply voltage V1 is VDD and the second power supply voltage V2 is GND, for example.

The voltage divider circuit 102 is connected between the first terminal and the second terminal, and divides the reference voltage Vb to output the reference voltage Vref to the non-inverting input terminal of the operational amplifier 104.

The switch 103 is connected between the first terminal and the reference voltage generation circuit 101, and is turned on or off in accordance with the control signal SEL1. In the case where the switch 103 is in an on state, the first power supply voltage V1 is supplied to the reference voltage generation circuit 101 from the first terminal. In the case where the switch 103 is in an off state, supply of the first power supply voltage V1 to the reference voltage generation circuit 101 from the first terminal is stopped.

In the operational amplifier 104, the reference voltage Vref is input to the non-inverting input terminal and the output voltage Vout is output from the output terminal. Further, part of the output voltage Vout is fed back to the inverting input terminal.

The bias circuit 109 is connected between the first terminal and the operational amplifier 104 and supplies bias current to the operational amplifier 104.

The holding circuit 108 is connected between the reference voltage generation circuit 101 and the bias circuit 109. The holding circuit 108 includes a switch 119 and a capacitor 120. One end of the switch 119 is connected to the reference voltage generation circuit 101 and the other end is connected to the bias circuit 109 and one of a pair of electrodes of the capacitor 120. The other of the pair of electrodes of the capacitor 120 is connected to the first terminal. Here, a connection point to which the other end of the switch 119, the one of the pair of electrodes of the capacitor 120, and the bias circuit 109 are connected is a node C.

The switch 119 is turned on or off in accordance with the control signal SEL2. In the case where the switch 119 is in an on state, the reference voltage Vb output from the reference voltage generation circuit 101 is supplied to the bias circuit 109. In the case where the switch 119 is in an off state, the reference voltage Vb output from the reference voltage generation circuit 101 is held in the node C.

Since the structure of the holding circuit 107 is similar to that in Embodiment 1, detailed description thereof is omitted.

Figure 5:
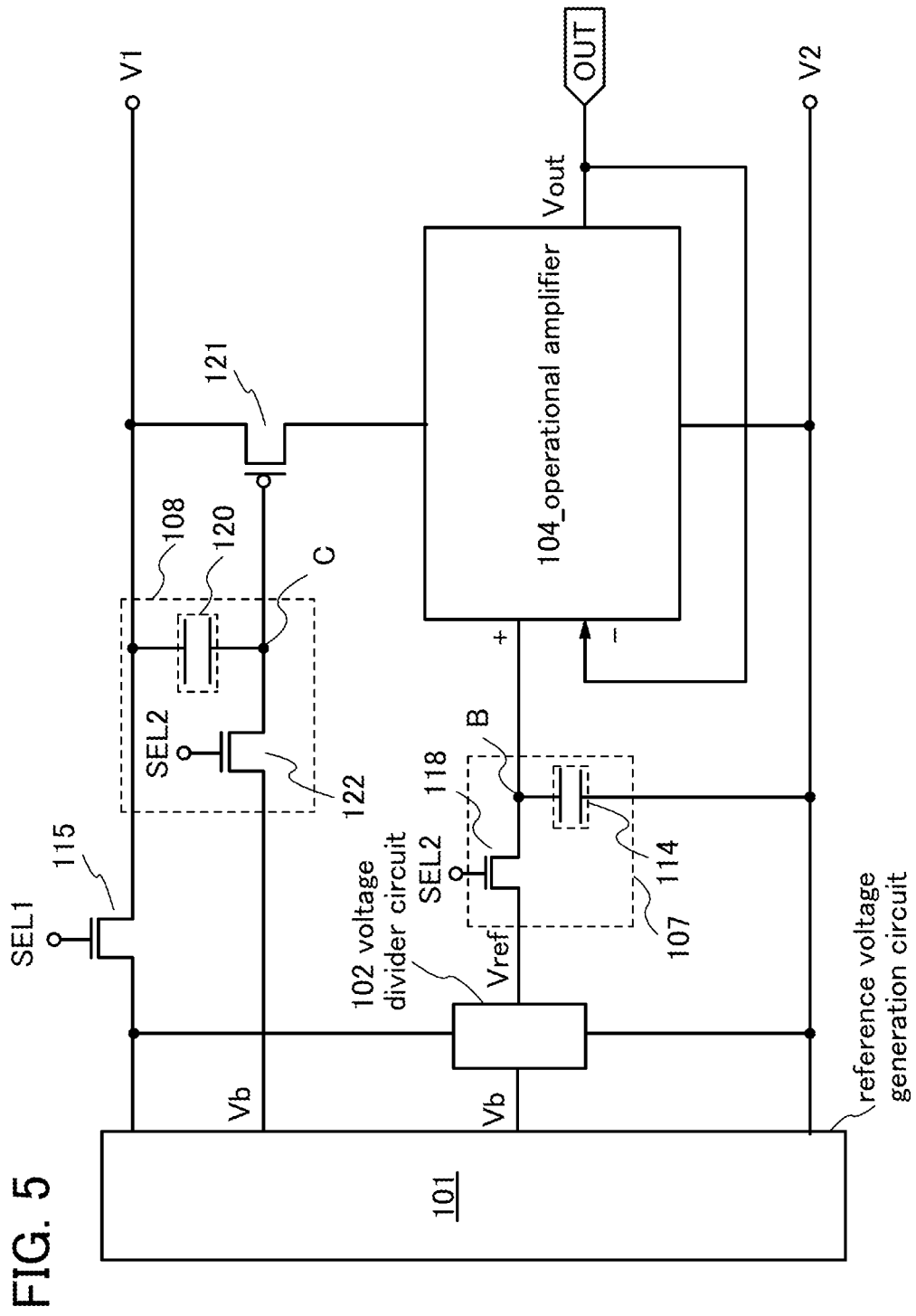
FIG. 5 is a block diagram of a signal processing circuit.

FIG. 5 illustrates examples of the bias circuit 109 and the holding circuit 108 in the signal processing circuit illustrated in FIG. 4.

As the bias circuit 109, for example, a transistor 121 which is turned on or off in accordance with the reference voltage Vb output from the reference voltage generation circuit 101 is used. The transistor 121 is turned on when voltage in the node C is higher than or equal to the threshold voltage of the transistor 121. In this case, the bias current is supplied to the operational amplifier 104. The transistor 121 is turned off when the voltage in the node C is lower than the threshold voltage of the transistor 121. In this case, supply of the bias current to the operational amplifier 104 is stopped. Note that the transistor 121 is a p-channel transistor in FIG. 5.

The switch 119 in the holding circuit 108 is, for example, a transistor 122 which is turned on or off in accordance with the control signal SEL2. Here, a transistor with significantly small off-state current is used as the transistor 122. Note that a transistor similar to the transistor 118 illustrated in FIG. 2 can be used as the transistor with significantly small off-state current.

When the transistor 122 with extremely small off-state current is used as the switch 119 in the holding circuit 108 and the transistor 122 is in an off state, voltage of the one of the pair of electrodes of the capacitor 120 can be held for a long time. In other words, in the case where the switch 119 is in an off state, the voltage in the node C in the holding circuit 108 can be held for a long time.

Next, operation of the signal processing circuit illustrated in FIG. 5 is described.

First, the control signal SEL1 is input to the transistor 115 and the transistor 115 is turned on, whereby the first power supply voltage V1 is supplied to the reference voltage generation circuit 101 from the first terminal. In the case where the transistor 115 is an n-channel transistor, a high-level potential may be input as the control signal SEL1, whereas in the case where the transistor 115 is a p-channel transistor, a low-level potential may be input as the control signal SEL1. Note that described below is the case where the transistor 115, the transistor 118, and the transistor 122 are n-channel transistors. The reference voltage generation circuit 101 operates with the first power supply voltage V1 supplied thereto, and outputs the reference voltage Vb to the holding circuit 108 and to the voltage divider circuit 102.

The voltage divider circuit 102 outputs the reference voltage Vref obtained by dividing the reference voltage Vb to the holding circuit 107.

The control signal SEL2 is set to a high level and the transistor 118 and the transistor 122 are turned on. When the transistor 122 is turned on, the reference voltage Vb output from the reference voltage generation circuit 101 is supplied to the transistor 121. Thus, the transistor 121 is turned on and the first power supply voltage V1 is supplied to the operational amplifier 104 from the first terminal. Further, when the transistor 118 is turned on, the reference voltage Vref output from the voltage divider circuit 102 is output to the non-inverting input terminal of the operational amplifier 104. Thus, the operational amplifier 104 operates: the output voltage Vout is output from the output terminal and part of the output voltage Vout is output to the inverting input terminal of the operational amplifier 104.

After the signal processing circuit illustrated in FIG. 5 reaches a steady state (the state where the reference voltage Vb is normally supplied to the transistor 121 and the reference voltage Vref is normally supplied to the non-inverting input terminal of the operational amplifier 104), the control signal SEL2 is set to a low level, and thus, the transistor 118 and the transistor 122 are turned off. Since the transistor 118 and the transistor 122 are transistors with significantly small off-state current, the voltage in the node B (reference voltage Vref) and voltage in the node C (reference voltage Vb) can be held for a long time.

Next, the control signal SEL1 is set to a low level and the transistor 115 is turned off. Thus, supply of the first power supply voltage V1 to the reference voltage generation circuit 101 from the first terminal is stopped. Since the first power supply voltage V1 is not supplied to the reference voltage generation circuit 101, the reference voltage generation circuit 101 stops operating.

In the signal processing circuit illustrated in FIG. 5, the transistor 122 with significantly small off-state current is used in the holding circuit 108. Therefore, by turning off the transistor 122, the voltage in the node C (reference voltage Vb) can be held for a long time. Thus, even when the reference voltage generation circuit 101 stops operating, the reference voltage Vb can still be supplied to the transistor 121. Similarly, the transistor 118 with significantly small off-state current is used in the holding circuit 107. Therefore, by turning off the transistor 118, the voltage in the node B (reference voltage Vref) can be held for a long time. Thus, even when the reference voltage generation circuit 101 stops operating, the reference voltage Vref can still be supplied to the non-inverting input terminal of the operational amplifier 104.

According to an embodiment of the present invention, since the transistor 122 including an oxide semiconductor is used as the switch 119, the off-state current thereof can be 100 yA. When the capacitance of the capacitor 120 is, for example, 1 pF, the node C can hold the reference voltage Vb for $10^7$ seconds (approximately 115 days).

Similarly, since the transistor 118 including an oxide semiconductor is used as the switch 113, the off-state current thereof can be 100 yA. When the capacitance of the capacitor 114 is, for example, 1 pF, the node B can hold the reference voltage Vref for $10^7$ seconds (approximately 115 days).

Accordingly, the reference voltage generation circuit 101 can stop operating for $10^7$ seconds (approximately 115 days). Before $10^7$ seconds (approximately 115 days) pass, the reference voltage generation circuit 101 may operate and the reference voltage Vb and the reference voltage Vref may be output to the holding circuit 108 and the holding circuit 107, respectively, by turning on the transistor 115 and supplying the first power supply voltage V1 to the reference voltage generation circuit 101.

In an embodiment of the present invention, transistors each of whose channels is formed in an oxide semiconductor film are used as the switches 113 and 119. For example, even when the switch 113 is turned off after a potential of the node B at which the switch 113 and the capacitor 114 are connected is kept constant, the amount of electric charges leaking through the switch 113 can be extremely small.

Therefore, when the switch 119 included in the holding circuit 108 is in an off state, the voltage output from the reference voltage generation circuit 101 can be held in the node C at which the switch 119 and the capacitor 120 are connected. Further, when the switch 113 included in the holding circuit 107 is in an off state, the voltage output from the voltage divider circuit 102 can be held in the node B at which the switch 113 and the capacitor 114 are connected.

Accordingly, the reference voltage generation circuit 101 does not need to keep outputting voltage to the bias circuit 109 or the operational amplifier 104, so that the reference voltage generation circuit 101 does not need to continuously operate. Thus, supply of power to the reference voltage generation circuit 101 can be stopped by turning off the transistor 115, whereby power consumed by the reference voltage generation circuit 101 can be reduced.

In this embodiment, although the case where the switch 113 and the switch 119 are each a transistor including an oxide semiconductor is described, the switch 103 may be a transistor including an oxide semiconductor.

Further, the switch 103, the switch 113, and the switch 119 may each be a transistor in which upper and lower gates are provided with an oxide semiconductor layer provided therebetween. In the case of the switch 103, the control signal SEL1 can be input to one gate, and a different control signal can be input to the other gate. In the case of the switch 113 and the switch 119, the control signal SEL2 can be input to one gate and a different control signal can be input to the other gate. The different control signal may be a signal with a fixed potential. The fixed potential may be either a low power supply potential or a high power supply potential. Note that the upper and lower gates may be electrically connected to each other and a control signal may be input. The threshold voltage of the transistor or the like can be controlled by a signal input to the other gate. Further, the off-state current of the transistor can be further reduced.

Although the case where the control signal SEL1 and the control signal SEL2 are different signals is described in this embodiment, the control signal SEL1 and the control signal SEL2 may be the same signal.

In the case where the reference voltage generation circuit 101, the voltage divider circuit 102, and the operational amplifier 104 include transistors, the transistors may each be a transistor whose channel is formed in a layer or a substrate including a semiconductor other than an oxide semiconductor. For example, the transistors can each be a transistor whose channel is formed in a silicon layer or a silicon substrate.

Figure 6:
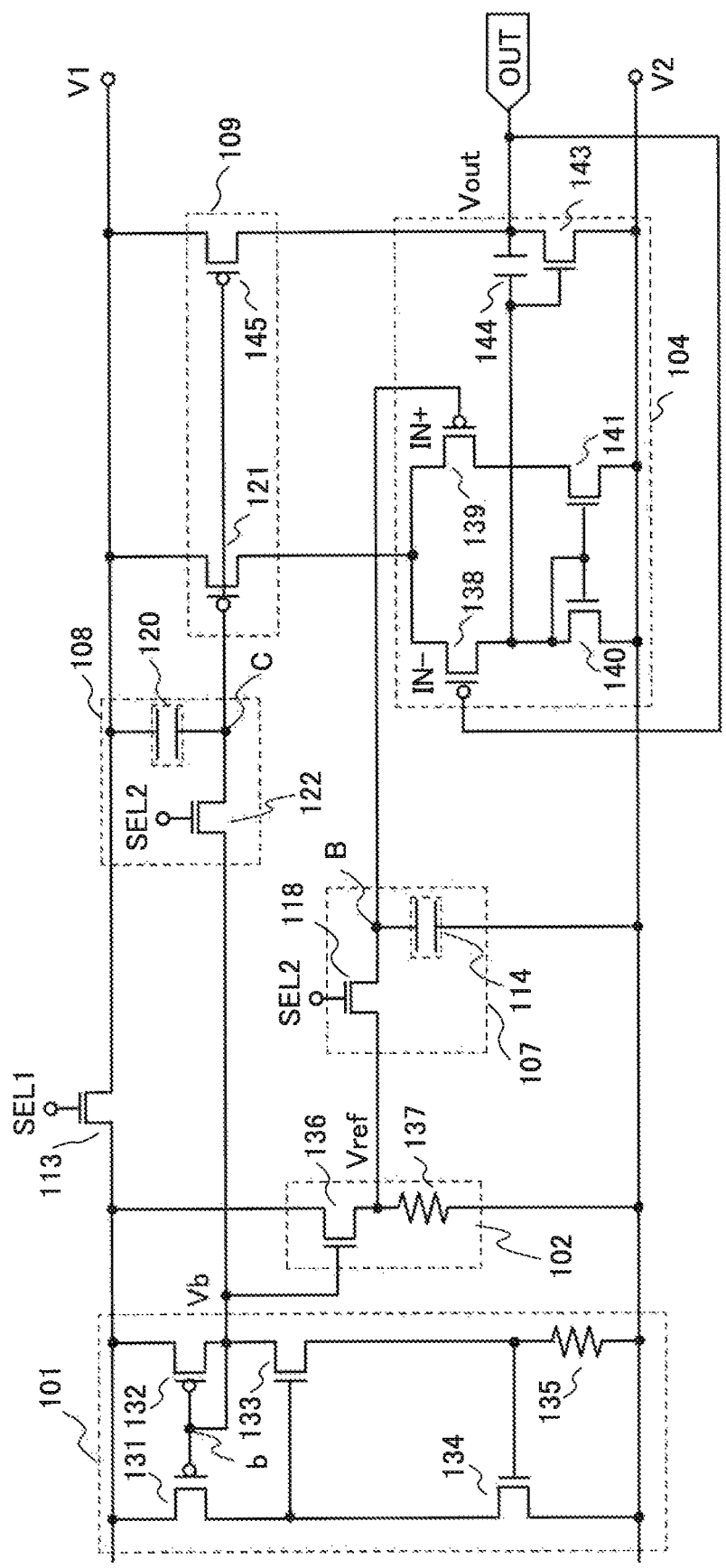
FIG. 6 is a circuit diagram of a signal processing circuit.

FIG. 6 illustrates the signal processing circuit illustrated in FIG. 4 in more detail.

The reference voltage generation circuit 101 includes the transistors 131 to 134 and the resistor 135. The node b is connected to the gate of the transistor 136 in the voltage divider circuit 102 and one of a source and a drain of the transistor 122 in the holding circuit 108. The reference voltage Vb is the voltage in the node b.

The voltage divider circuit 102 includes the transistor 136 and the resistor 137. The one of the source and the drain of the transistor 136 is connected to the one of the source and the drain of the transistor 118 in the holding circuit 107.

The operational amplifier 104 includes the transistors 138 to 141, the transistor 143, and the capacitor 144. The transistor 138 and the transistor 139 form a differential circuit. The transistor 140 and the transistor 141 form a current mirror circuit. The transistor 143 and the capacitor 144 form a buffer circuit.

Although an example in which a signal processing circuit includes an operational amplifier is described in this embodiment, the signal processing circuit may include a comparator instead of the operational amplifier.

The bias circuit 109 includes the transistor 121 and a transistor 145. The transistor 121 and the transistor 145 are p-channel transistors.

In the signal processing circuit illustrated in FIG. 4, FIG. 5, and FIG. 6, the holding circuit 108 is connected between the reference voltage generation circuit 101 and the bias circuit 109, so that the reference voltage Vb output from the reference voltage generation circuit 101 can be held in the holding circuit 108. Further, the holding circuit 107 is connected between the voltage divider circuit 102 and the operational amplifier 104, so that the reference voltage Vref output from the voltage divider circuit 102 can be held in the holding circuit 107. Thus, the reference voltage generation circuit 101 can stop operating during a period in which the reference voltage Vb is held in the holding circuit 108 and the reference voltage Vref is held in the holding circuit 107, so that power consumed by the reference voltage generation circuit 101 can be reduced. Consequently, power consumed by the signal processing circuit can be reduced.

Next, another embodiment of a signal processing circuit according to an embodiment of the present invention will be described with reference to FIG. 7 and FIG. 8.

Figure 7:
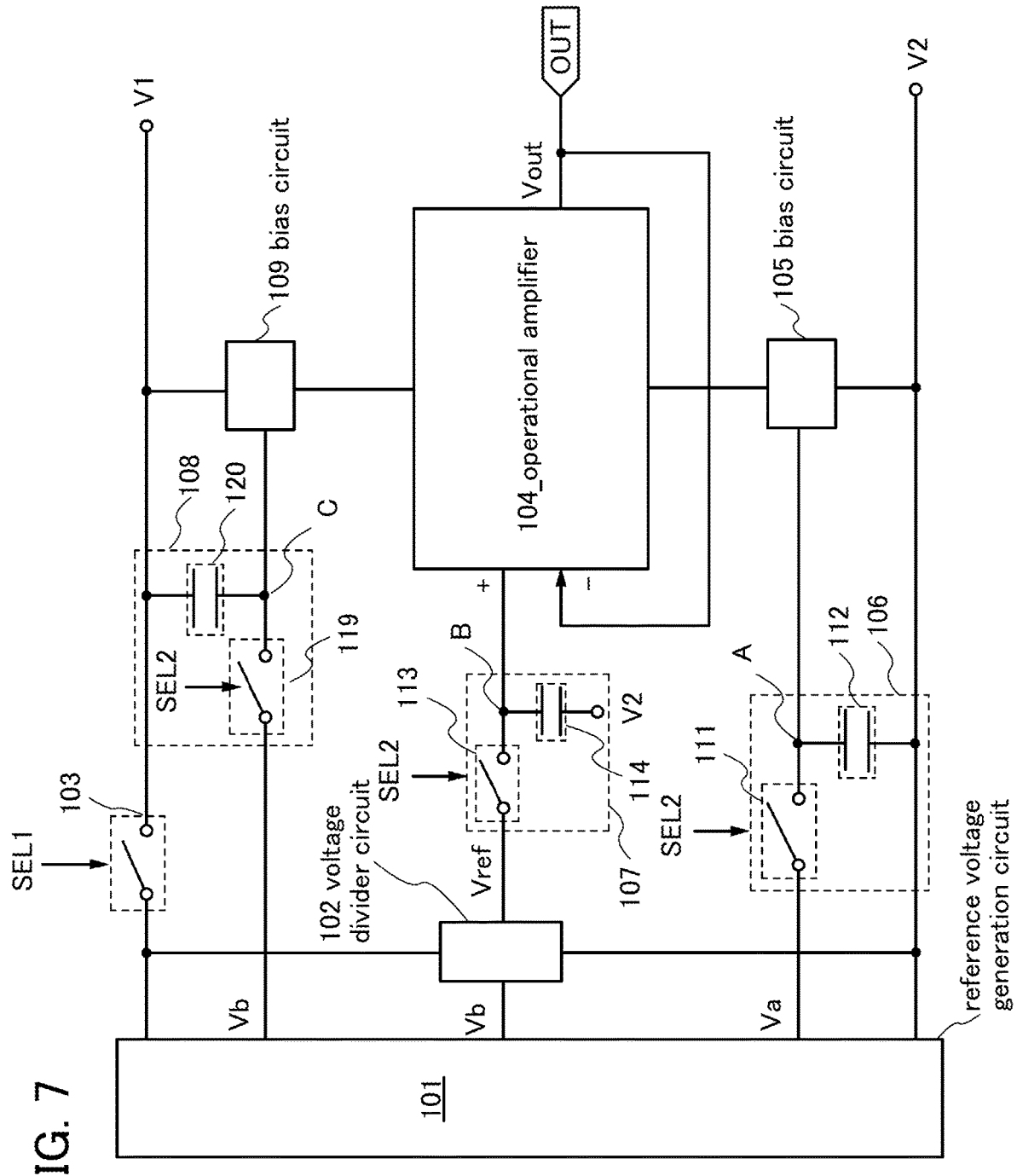
FIG. 7 is a block diagram of a signal processing circuit.

FIG. 7 is a block diagram of a signal processing circuit. The signal processing circuit illustrated in FIG. 7 includes the reference voltage generation circuit 101, the voltage divider circuit 102, the switch 103, the operational amplifier 104, the bias circuit 105, the holding circuit 106, the holding circuit 107, the holding circuit 108, and the bias circuit 109.

The reference voltage generation circuit 101 is connected between the first terminal supplied with the first power supply voltage V1 and the second terminal supplied with the second power supply voltage V2, and outputs the reference voltage Va to the bias circuit 105 and the reference voltage Vb to the voltage divider circuit 102 and the holding circuit 108. The first power supply voltage V1 is VDD and the second power supply voltage V2 is GND, for example.

The voltage divider circuit 102 is connected between the first terminal and the second terminal, and divides the reference voltage Vb to output the reference voltage Vref to the non-inverting input terminal of the operational amplifier 104.

The switch 103 is connected between the first terminal and the reference voltage generation circuit 101, and is turned on or off in accordance with the control signal SEL1. In the case where the switch 103 is in an on state, the first power supply voltage V1 is supplied to the reference voltage generation circuit 101 from the first terminal. In the case where the switch 103 is in an off state, supply of the first power supply voltage V1 to the reference voltage generation circuit 101 from the first terminal is stopped.

In the operational amplifier 104, the reference voltage Vref is input to the non-inverting input terminal and the output voltage Vout is output from the output terminal. Further, part of the output voltage Vout is fed back to the inverting input terminal.

The bias circuit 109 is connected between the first terminal and the operational amplifier 104. The bias circuit 105 is connected between the second terminal and the operational amplifier 104. The bias circuit 109 and the bias circuit 105 each supply bias current to the operational amplifier 104.

As in the signal processing circuit illustrated in FIG. 1, the holding circuit 106 is connected between the reference voltage generation circuit 101 and the bias circuit 105, and the holding circuit 107 is connected between the voltage divider circuit 102 and the non-inverting input terminal of the operational amplifier 104. As in the signal processing circuit illustrated in FIG. 4, the holding circuit 108 is connected between the reference voltage generation circuit 101 and the bias circuit 109.

Each of the holding circuits 106 to 108 includes a switch and a capacitor. The switches included in the holding circuits 106 to 108 are turned on or off in accordance with the control signal SEL2.

FIG. 1, FIG. 2, FIG. 3, FIG. 4, FIG. 5, FIG. 6, and FIG. 7 can be referred to for the details of the holding circuits 106 to 108.

Figure 8:
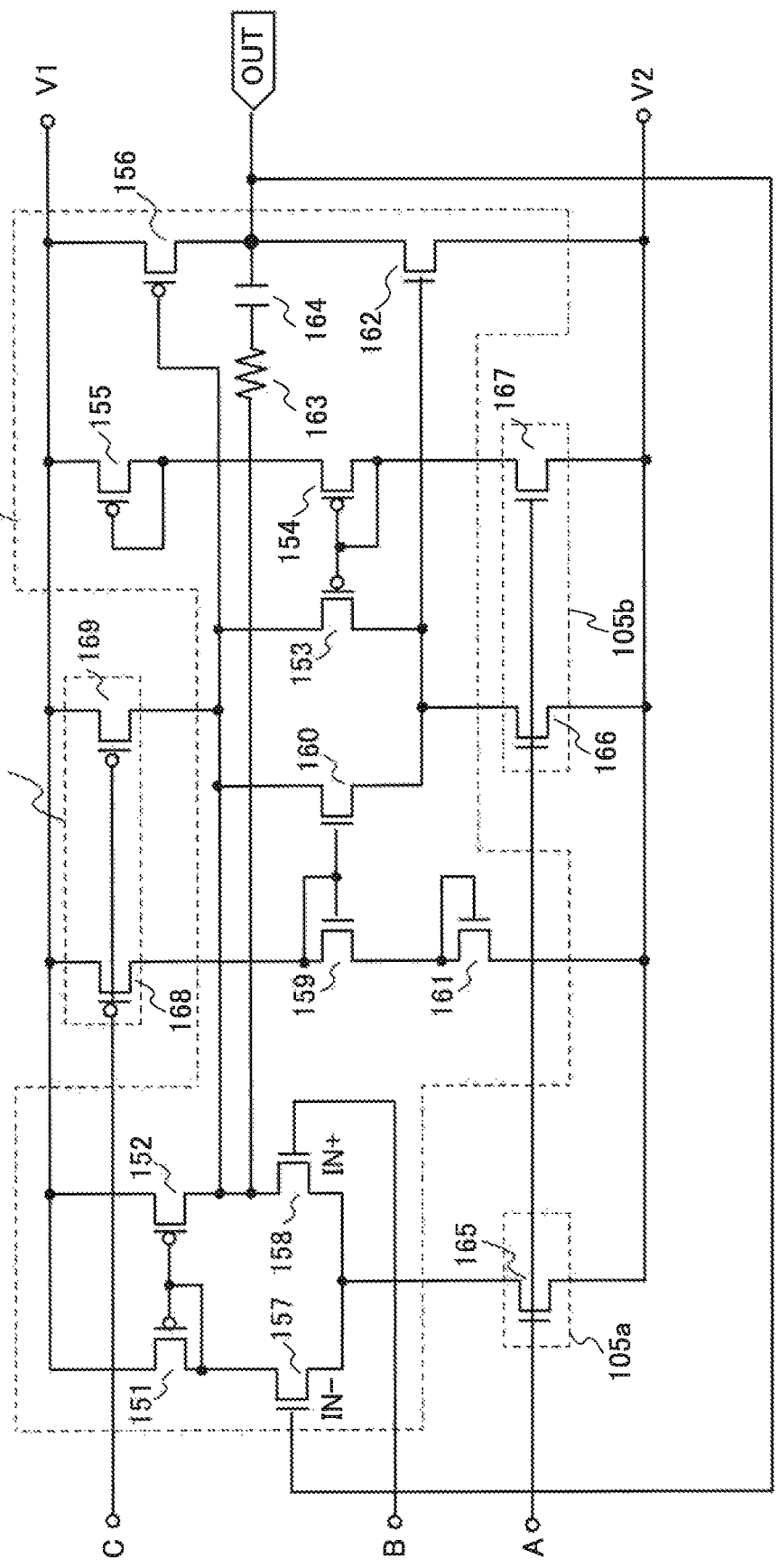
FIG. 8 is a circuit diagram illustrating part of a signal processing circuit.

FIG. 8 illustrates examples of the operational amplifier 104, the bias circuit 105, and the bias circuit 109 in the signal processing circuit illustrated in FIG. 7.

The operational amplifier 104 includes transistors 151 to 162, a resistor 163, and a capacitor 164. The transistors 151 to 156 are p-channel transistors and the transistors 157 to 162 are n-channel transistors.

A bias circuit 105a includes a transistor 165 and a bias circuit 105b includes a transistor 166 and a transistor 167. The transistors 165 to 167 are n-channel transistors.

The bias circuit 109 includes a transistor 168 and a transistor 169. The transistor 168 and the transistor 169 are p-channel transistors.

A terminal A corresponds to the node A of the holding circuit 106 in the signal processing circuit illustrated in FIG. 7, a terminal B corresponds to the node B of the holding circuit 107 in the signal processing circuit illustrated in FIG. 7, and a terminal C corresponds to the node C of the holding circuit 108 in the signal processing circuit illustrated in FIG. 7.

In the signal processing circuit illustrated in FIG. 7 and FIG. 8, the holding circuit 106 is connected between the reference voltage generation circuit 101 and the bias circuit 105a, so that the reference voltage Va output from the reference voltage generation circuit 101 can be held in the holding circuit 106. The holding circuit 107 is connected between the voltage divider circuit 102 and the operational amplifier 104, so that the reference voltage Vref output from the voltage divider circuit 102 can be held in the holding circuit 107. The holding circuit 108 is connected between the reference voltage generation circuit 101 and the bias circuit 109, so that the reference voltage Vb output from the reference voltage generation circuit 101 can be held in the holding circuit 108.

Thus, the reference voltage generation circuit 101 can stop operating during a period in which the reference voltage Va is held in the holding circuit 106, the reference voltage Vref is held in the holding circuit 107, and the reference voltage Vb is held in the holding circuit 108, so that power consumed by the reference voltage generation circuit 101 can be reduced. Consequently, power consumed by the signal processing circuit can be reduced.

The signal processing circuit described in this embodiment can be used for, for example, an AC-DC converter, a sensor, or the like. The signal processing circuit described in this embodiment is particularly effectively used in a circuit in which an analog circuit such as an operational amplifier or a comparator is used and a fixed voltage or a signal is continuously output.

This embodiment can be combined with any of the other embodiments as appropriate.

Embodiment 3

In this embodiment, another embodiment of a signal processing circuit according to an embodiment of the present invention will be described with reference to FIG. 11.

Figure 11:
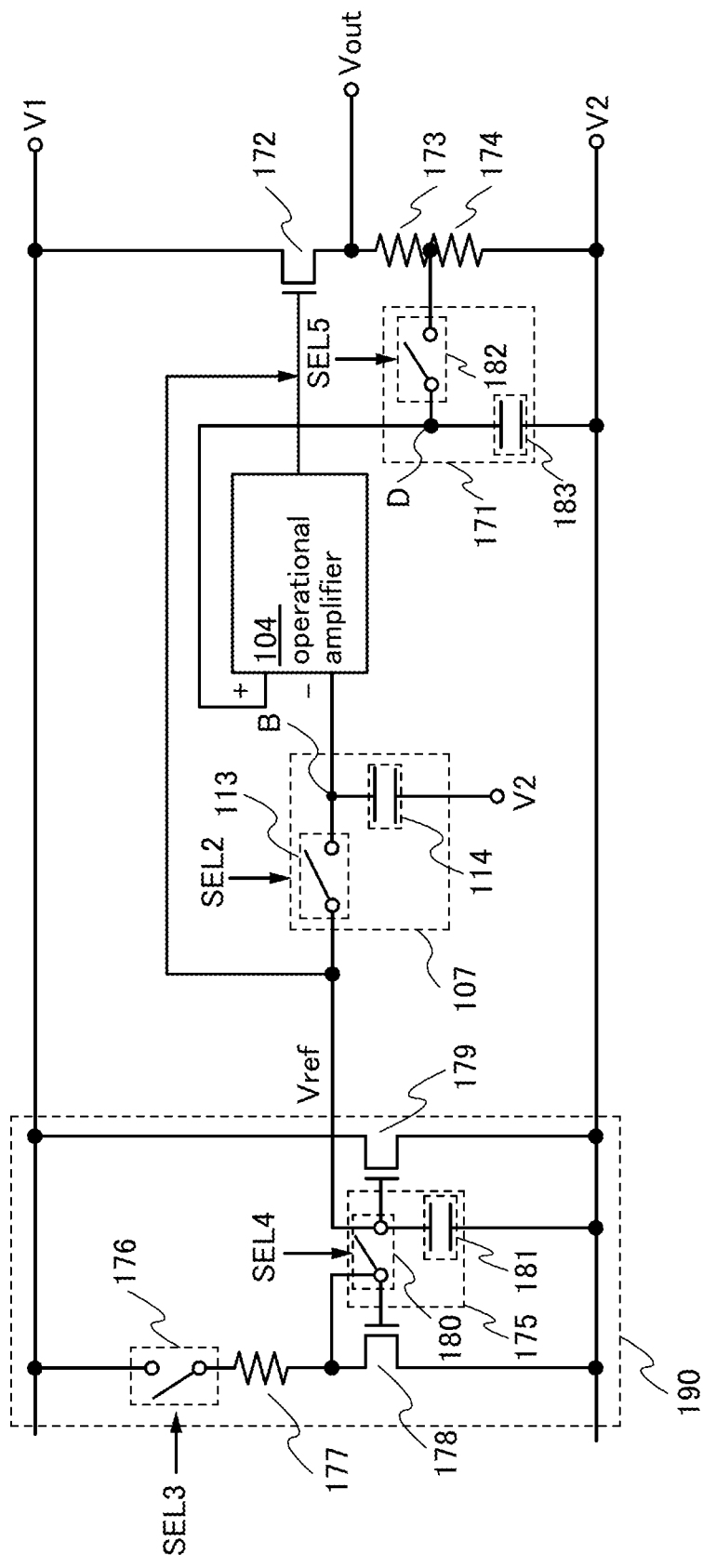
FIG. 11 is a circuit diagram of a signal processing circuit.

FIG. 11 is a circuit diagram of a signal processing circuit. The signal processing circuit illustrated in FIG. 11 includes a reference voltage generation circuit 190, the operational amplifier 104, the holding circuit 107, a holding circuit 171, a transistor 172, and resistors 173 and 174.

In this embodiment, the structure of the reference voltage generation circuit 190 illustrated in FIG. 11 is partly different from the structure of the reference voltage generation circuit 101 described in the above embodiments. The reference voltage generation circuit 190 illustrated in FIG. 11 includes a holding circuit 175, a switch 176, a resistor 177, and transistors 178 and 179. The holding circuit 175 includes a switch 180 and a capacitor 181. The reference voltage generation circuit 190 is connected between the first terminal supplied with the first power supply voltage V1 and the second terminal supplied with the second power supply voltage V2, and outputs the reference voltage Vref to the holding circuit 107.

The switch 176 is connected between the first terminal and one terminal of the resistor 177 and is turned on or off in accordance with a control signal SEL3. In the case where the switch 176 is in an on state, the first power supply voltage V1 is supplied to the reference voltage generation circuit 190 from the first terminal. In the case where the switch 176 is in an off state, supply of the first power supply voltage V1 to the reference voltage generation circuit 190 from the first terminal is stopped.

The other terminal of the resistor 177 is electrically connected to a gate and one of a source and a drain of the transistor 178 and one end of the switch 180. The other end of the switch 180 is electrically connected to one of a pair of electrodes of the capacitor 181 and a gate of the transistor 179. One of a source and a drain of the transistor 179 is electrically connected to the first terminal. The other of the source and the drain of the transistor 178, the other of the pair of electrodes of the capacitor 181, and the other of the source and the drain of the transistor 179 are electrically connected to the second terminal.

The holding circuit 175 includes the switch 180 and the capacitor 181. The switch 180 in the holding circuit 175 is, for example, a transistor which is turned on or off in accordance with a control signal SEL4. A transistor with significantly small off-state current is used as the transistor.

When a transistor with extremely small off-state current is used as the switch 180 in the holding circuit 175 and the transistor is in an off state, voltage of the one of the pair of electrodes of the capacitor 181 can be held for a long time. In other words, in the case where the switch 180 is in an off state, the reference voltage Vref can be held in the holding circuit 175 for a long time.

The reference voltage Vref is input to the inverting input terminal of the operational amplifier 104. The non-inverting input terminal of the operational amplifier 104 is connected to the holding circuit 171. The output terminal of the operational amplifier 104 is connected to a gate of the transistor 172.

One of a source and a drain of the transistor 172 is connected to the first terminal and the other is connected to one terminal of the resistor 173 and the output terminal. The output voltage Vout is output from the output terminal. The other terminal of the resistor 173 is connected to one terminal of the resistor 174. The other terminal of the resistor 174 is connected to the second terminal.

The holding circuit 171 includes a switch 182 and a capacitor 183. The switch 182 in the holding circuit 171 is, for example, a transistor which is turned on or off in accordance with a control signal SEL5. A transistor with significantly small off-state current is used as the transistor.

When a transistor with extremely small off-state current is used as the switch 182 in the holding circuit 171 and the transistor is in an off state, voltage of one of a pair of electrodes of the capacitor 183 can be held for a long time. In other words, in the case where the switch 182 is in an off state, voltage of a node D can be held in the holding circuit 171 for a long time.

Next, operation of the signal processing circuit illustrated in FIG. 11 is described.

First, the control signal SEL3 is input to the switch 176 and the switch 176 is turned on, whereby the first power supply voltage V1 is supplied to the reference voltage generation circuit 190 from the first terminal. In the case where the switch 176 is an n-channel transistor, a high-level potential may be input as the control signal SEL3, whereas in the case where the switch 176 is a p-channel transistor, a low-level potential may be input as the control signal SEL3. Note that described below is the case where the switch 113, the switch 182, the switch 176, and the switch 180 are n-channel transistors. In this case, the control signal SEL4 is set to a high level and the switch 180 is turned on, so that the reference voltage Vref is output to the holding circuit 107.

The control signal SEL2 is set to a high level and the switch 113 is turned on, so that the reference voltage Vref output from the reference voltage generation circuit 190 is output to the inverting input terminal of the operational amplifier 104. Consequently, the operational amplifier 104 operates, and voltage output from the output terminal of the operational amplifier 104 is input to the gate of the transistor 172.

After the signal processing circuit illustrated in FIG. 11 reaches a steady state (the state where the reference voltage Vref is normally supplied to the inverting input terminal of the operational amplifier), the control signal SEL4 is set to a low level, so that the switch 180 is turned off. A transistor with significantly small off-state current is used as the switch 180, whereby the reference voltage Vref can be held for a long time.

Since the reference voltage Vref can be held for a long time, the first power supply voltage V1 does not need to be continuously supplied to the reference voltage generation circuit 190 from the first terminal. Therefore, the switch 176 can be turned off by setting the control signal SEL3 to a low level.

Further, in the signal processing circuit illustrated in FIG. 11, in order that a potential of an output (VOUT) node is kept constant even when load change occurs on the VOUT side, a feedback portion is provided for the operational amplifier 104 for feedback control in some cases. However, the operational amplifier 104 constantly consumes power; therefore, the switch 182 in the holding circuit 171 is turned off so as to fix the voltage of a feedback input portion in the case where feedback is not needed (e.g., in the case where load change on the output side is small). Further, in the case where the switch 182 in the holding circuit 171 is turned off, the switch 113 in the holding circuit 107 needs to be turned off. Thus, power consumption of the operational amplifier 104 can be further reduced in the case where feedback is not needed.

Although a voltage divider circuit is not provided in the signal processing circuit in this embodiment, a voltage divider circuit may be provided as in the signal processing circuits described in the above embodiments. For example, in FIG. 11, a voltage divider circuit may be connected between the first terminal and the second terminal and the reference voltage Vref of the reference voltage generation circuit 190 may be input to the voltage divider circuit. In this case, output of the voltage divider circuit may be input to the holding circuit 107 and the output terminal of the operational amplifier 104.

This embodiment can be combined with any of the other embodiments as appropriate.

Embodiment 4

Figure 9:
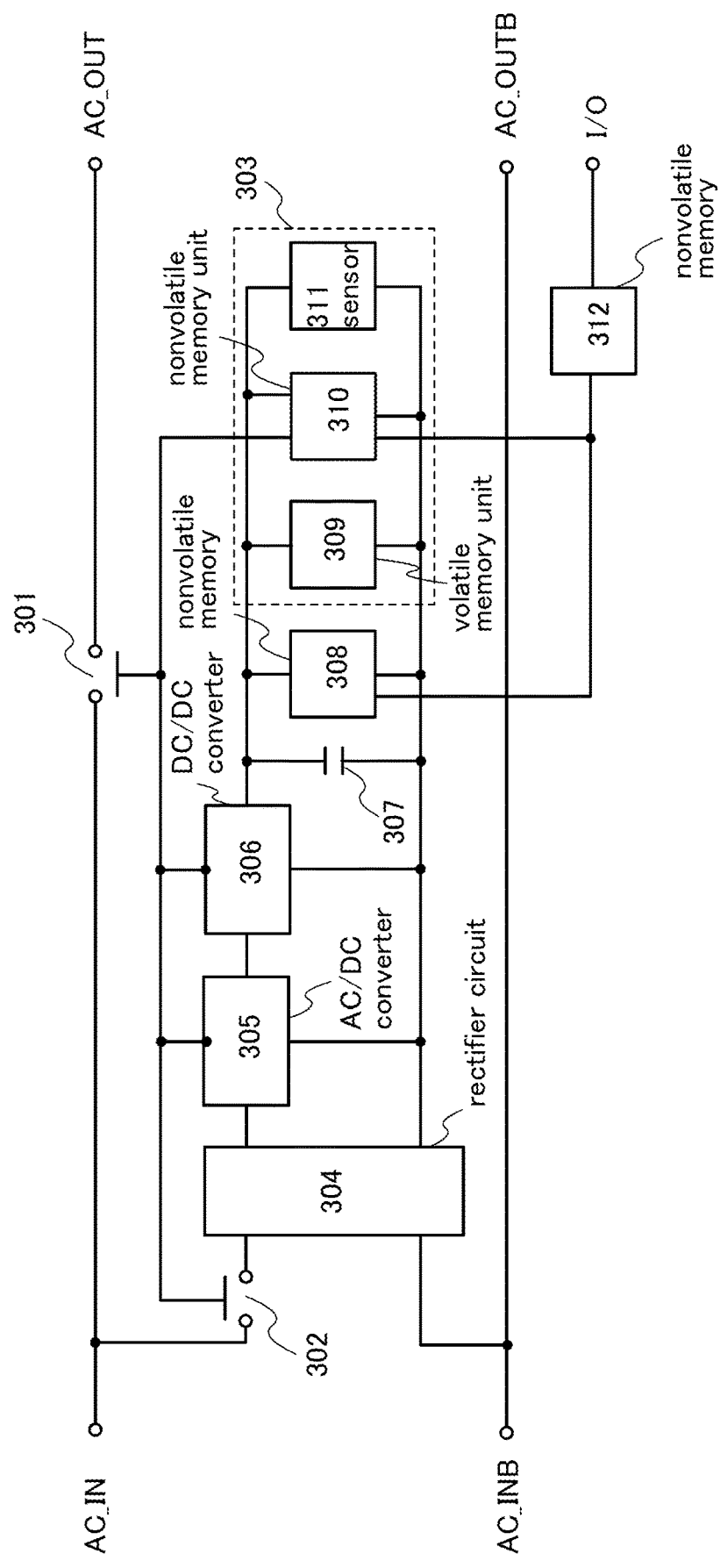
FIG. 9 is a block diagram of a power supply control device.

In this embodiment, an example of a power supply control device in which any of the signal processing circuits described in the above embodiments can be used will be described with reference to FIG. 9. A power supply control device 300 illustrated in FIG. 9 supplies power to external devices by outputting AC signals which are input from a terminal AC_IN and a terminal AC_INB, from a terminal AC_OUT and a terminal AC_OUTB.

The power supply control device 300 includes a main switch 301, a sub-switch 302, and a data processing device 303. The power supply control device 300 further includes a rectifier circuit 304, an AC/DC converter 305, a DC/DC converter 306, a capacitor 307, a nonvolatile memory 308, and a nonvolatile memory 312. The data processing device 303 includes a volatile memory unit 309, a nonvolatile memory unit 310, and a sensor 311.

The main switch 301 is turned on, whereby the AC signals which are input from the terminal AC_IN and the terminal AC_INB are output from the terminal AC_OUT and terminal AC_OUTB to the external devices. The main switch 301 is turned off, whereby the output of the AC signals which are input from the terminal AC_IN and the terminal AC_INB, from the terminal AC_OUT and the terminal AC_OUTB to the external devices is stopped. The main switch 301 is turned on or off by being controlled by the data processing device 303 in accordance with a status of use of the external devices. Turning off the main switch 301 makes it possible to reduce the standby power of the external devices.

The sub-switch 302 is turned on, whereby the AC signals which are input from the terminal AC_IN and the terminal AC_INB are output to the rectifier circuit 304. The sub-switch 302 is turned off, whereby the output of the AC signals which are input from the terminal AC_IN and the terminal AC_INB, to the rectifier circuit 304 is stopped. The sub-switch 302 is turned on or off by being controlled by the data processing device 303.

As the main switch and the sub-switch which are described in this specification, a switch which is capable of mechanically operating, such as a relay circuit, or a switch which is capable of electrical operation, such as a thyristor or a power transistor, can be used.

The rectifier circuit 304 is a circuit for rectifying an AC signal which is input.

The AC/DC converter 305 is a circuit for smoothing a signal which includes a ripple rectified in the rectifier circuit 304 into a DC signal to adjust a power factor.

The DC/DC converter 306 is a circuit for converting the DC signal obtained by the conversion in the AC/DC converter 305 into a DC signal having a voltage at which the data processing device 303 can operate.

The capacitor 307 is provided to hold the voltage which is obtained in the DC/DC converter 306 and at which the data processing device 303 can operate.

The nonvolatile memory 308 is a circuit for storing data or a program to be processed in the data processing device 303. Note that examples of a memory element included in the nonvolatile memory 308 include a ferroelectric memory (FeRAM), a magnetic memory (MRAM), a phase-change memory (PRAM), and a resistive random access memory (ReRAM) which utilizes an electric-field induced giant resistance change, in addition to a flash memory. The memory element may be any memory element as long as it can hold data even when not powered.

The volatile memory unit 309 included in the data processing device 303 is a memory circuit which stores a result of arithmetic performed in the data processing device 303, or data or a program which is used for the arithmetic when power is supplied. The memory circuit corresponds to a register which has a function of temporarily storing data in the data processing device 303. For example, the volatile memory unit 309 can be formed using a flip-flop. The volatile memory unit 309 is preferably configured to store data at a higher speed than the nonvolatile memory unit 310. When the volatile memory unit 309 stores data at a high speed, the performance of the data processing device 303 can be improved.

The nonvolatile memory unit 310 included in the data processing device 303 is a circuit for storing the result of the arithmetic or the data or the program used for the arithmetic, which is stored in the data processing device 303 when the supply of power is not performed. For example, the nonvolatile memory unit 310 can be formed using a nonvolatile memory element.

The data processing device 303 controls an on state and an off state of the main switch 301, controls an on state and an off state of the sub-switch 302, and performs arithmetic processing which is necessary for operating the devices provided in the power supply control device 300.

For example, the data processing device 303 makes data in process saved from the volatile memory unit 309 to the nonvolatile memory unit 310 every certain period and turns off the sub-switch 302. In addition, the data processing device 303 operates to turn on the sub-switch 302, return the data that is saved in the nonvolatile memory unit 310 to the volatile memory unit 309, and perform arithmetic processing again.

Further, the data processing device 303 includes the sensor 311. With the sensor 311, arithmetic processing can be performed in accordance with a signal from the sensor 311 and an on state and an off state of the main switch 301 can be controlled if needed.

Any of the signal processing circuits described in the above embodiments can be used as the sensor 311 included in the data processing device. By using any of the signal processing circuits described in the above embodiments as the sensor 311, the reference voltage output from the reference voltage generation circuit can be held in the holding circuit in the signal processing circuit. Accordingly, the reference voltage generation circuit can stop operating during a period in which the reference voltage is held in the holding circuit. Thus, power consumption of the reference voltage generation circuit can be reduced, leading to a reduction in power consumption of the signal processing circuit. Further, power consumption of the power supply control device including the signal processing circuit can be reduced.

Embodiment 5

In this embodiment, an example of a cross-sectional structure of a signal processing circuit according to an embodiment of the present invention will be described with reference to FIG. 10.

In the signal processing circuits described in the above embodiment, the reference voltage generation circuit 101, the voltage divider circuit 102, and the operational amplifier 104 are each formed using a transistor including silicon or the like, and the holding circuit 106, the holding circuit 107, the holding circuit 108, and the like stacked over those circuits are each formed using a transistor including an oxide semiconductor.

Figure 10:
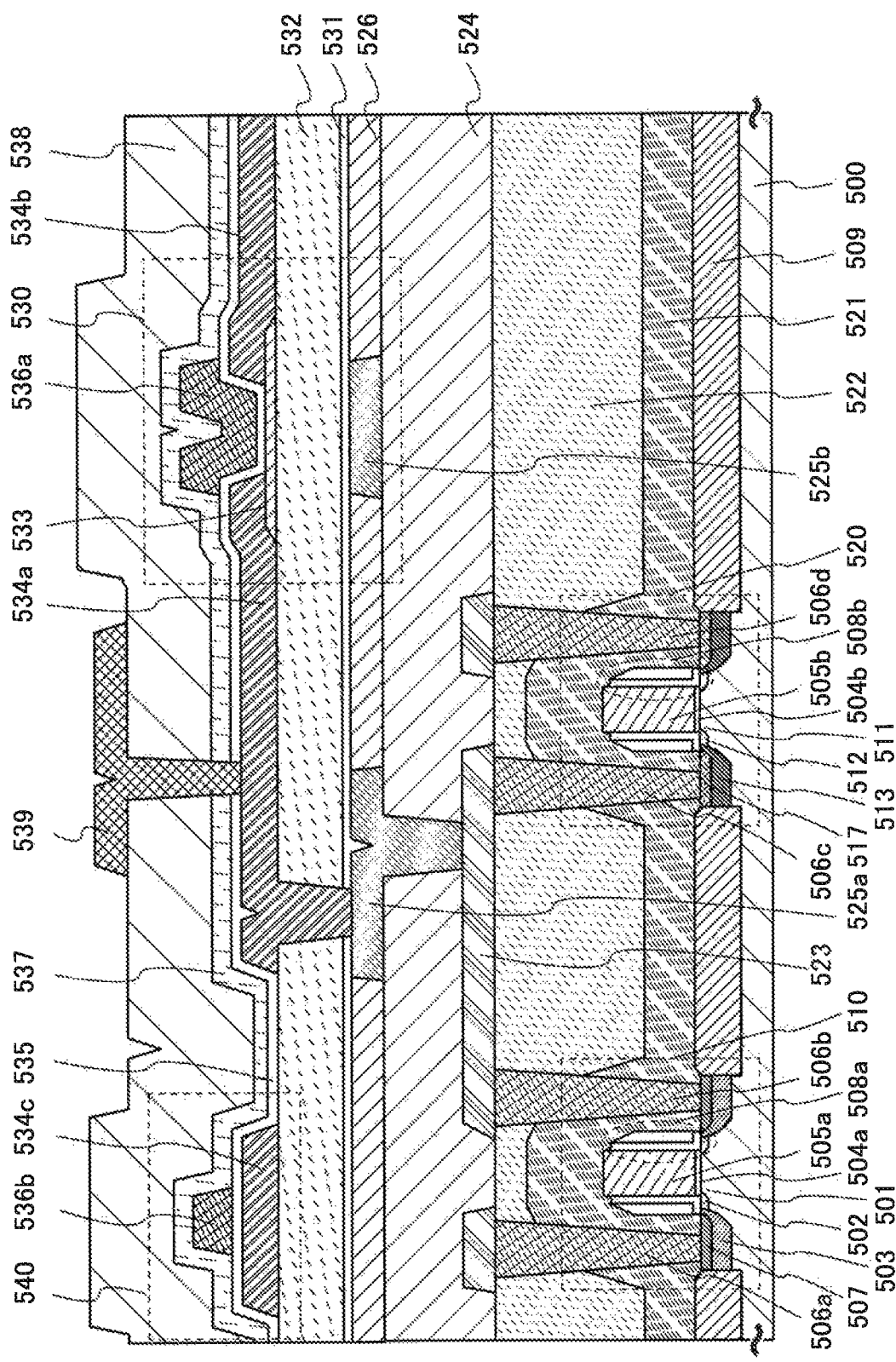
FIG. 10 is a cross-sectional view illustrating a method for manufacturing transistors.

FIG. 10 illustrates a cross section of part of a signal processing circuit according to an embodiment of the present invention. The signal processing circuit illustrated in FIG. 10 includes an n-channel transistor and a p-channel transistor each including a first semiconductor material (e.g., silicon) in a lower portion and a transistor including a second semiconductor material (e.g., an oxide semiconductor) and a capacitor in an upper portion.

<Structure of Transistor in Lower Portion>

An n-channel transistor 510 includes a channel formation region 501 provided in a substrate 500 including a semiconductor material, low-concentration impurity regions 502 and high-concentration impurity regions 503 (collectively simply referred to as impurity regions in some cases) with the channel formation region 501 provided between the impurity regions, intermetallic compound regions 507 provided in contact with the impurity regions, a gate insulating film 504a provided over the channel formation region 501, a gate electrode layer 505a provided over the gate insulating film 504a, and a source electrode layer 506a and a drain electrode layer 506b provided in contact with the intermetallic compound regions 507. Sidewall insulating films 508a are provided on side surfaces of the gate electrode layer 505a. An interlayer insulating film 521 and an interlayer insulating film 522 are provided to cover the transistor 510. The source electrode layer 506a and the drain electrode layer 506b are connected to the intermetallic compound regions 507 through openings formed in the interlayer insulating film 521 and the interlayer insulating film 522.

A p-channel transistor 520 includes a channel formation region 511 provided in the substrate 500 including the semiconductor material, low-concentration impurity regions 512 and high-concentration impurity regions 513 (collectively simply referred to as impurity regions in some cases) with the channel formation region 511 provided between the impurity regions, intermetallic compound regions 517 provided in contact with the impurity regions, a gate insulating film 504b provided over the channel formation region 511, a gate electrode layer 505b provided over the gate insulating film 504b, and a source electrode layer 506c and a drain electrode layer 506d provided in contact with the intermetallic compound regions 517. Sidewall insulating films 508b are provided on side surfaces of the gate electrode layer 505b. The interlayer insulating film 521 and the interlayer insulating film 522 are provided to cover the transistor 520. The source electrode layer 506c and the drain electrode layer 506d are connected to the intermetallic compound regions 517 through openings formed in the interlayer insulating film 521 and the interlayer insulating film 522.

Further, element separation insulating films 509 are provided for the substrate 500 to surround each of the transistor 510 and the transistor 520.

Although the case where the channels of the transistors 510 and 520 are formed in the semiconductor substrate is illustrated in FIG. 10, the channels of the transistors 510 and 520 may be formed in an amorphous semiconductor film or a polycrystalline semiconductor film formed over an insulating surface. Alternatively, the channels may be formed in a single crystal semiconductor film, like the case of using an SOI substrate.

When the transistors 510 and 520 are formed using a single crystal semiconductor substrate as the semiconductor substrate, the transistors 510 and 520 can operate at high speed. Accordingly, it is preferable that the reference voltage generation circuit, the voltage divider circuit, the operational amplifier, and the like in any of the signal processing circuits described in the above embodiments be formed using a single crystal semiconductor substrate.

The transistor 510 and the transistor 520 are connected to each other through a wiring 523, and an insulating film 524 is provided over the wiring 523. Further, conductive layers 525a and 525b and an insulating film 526 are provided over the insulating film 524. The insulating film 526 is preferably formed in such a manner that after the conductive layers 525a and 525b are formed over the insulating film 524, an insulating film is formed over the conductive layers 525a and 525b and then the insulating film is subjected to polishing treatment until upper surfaces of the conductive layers 525a and 525b are exposed.

<Structure of Transistor in Upper Portion>

A transistor 530 in an upper portion is a transistor whose channel is formed in a film of a semiconductor having a wider band gap than silicon. The transistor 530 includes the conductive layer 525b provided over the insulating film 524, an insulating film 531 and an insulating film 532 provided over the conductive layer 525b, a semiconductor film 533 provided over the insulating film 532, a source electrode layer 534a and a drain electrode layer 534b provided in contact with the semiconductor film 533, a gate insulating film 535 provided over the semiconductor film 533, the source electrode layer 534a, and the drain electrode layer 534b, and a gate electrode layer 536a provided over the gate insulating film 535. Note that the conductive layer 525b serves as a gate electrode layer.

FIG. 10 illustrates the case where upper and lower gate electrode layers are provided with a semiconductor film provided therebetween. A signal for controlling an on state and an off state is supplied to one of the gate electrode layers and the other of the gate electrode layers may be in a floating state (i.e., electrically insulated) or in a state where a potential is supplied. In the latter case, potentials with the same level may be supplied to the pair of gate electrode layers, or a fixed potential such as a ground potential may be supplied only to the other of the gate electrode layers. By controlling the level of a potential supplied to the other of the gate electrode layers, the threshold voltage of the transistor can be controlled.

A conductive layer 534c is provided over the insulating film 532, the gate insulating film 535 is provided over the conductive layer 534c, and a conductive layer 536b is provided over the gate insulating film 535. The conductive layer 534c, the gate insulating film 535, and the conductive layer 536b form a capacitor 540.

Further, an interlayer insulating film 537 and an interlayer insulating film 538 are provided to cover the transistor 530 and the capacitor 540. The source electrode layer 534a is connected to a wiring 539 through an opening formed in the interlayer insulating film 537 and the interlayer insulating film 538.

As the film of the semiconductor having a wider band gap than silicon, a film of a compound semiconductor such as an oxide semiconductor or a nitride semiconductor can be given. This embodiment explains the case where an oxide semiconductor is used for the semiconductor film 533.

The oxide semiconductor used for the transistor 530 is preferably a purified oxide semiconductor in which impurities serving as electron donors (donors), such as moisture or hydrogen, are reduced and oxygen vacancies are reduced. The purified oxide semiconductor is an i-type (intrinsic) semiconductor or a substantially i-type semiconductor. Therefore, a transistor including the oxide semiconductor has a characteristic of significantly small off-state current. Furthermore, the band gap of the oxide semiconductor is 2 eV or more, preferably 2.5 eV or more, more preferably 3 eV or more. With the use of the oxide semiconductor film which is purified by sufficiently reducing the concentration of impurities such as moisture or hydrogen and by reducing oxygen vacancies, the off-state current of the transistor can be significantly reduced.

Specifically, various experiments can prove small off-state current of a transistor in which a purified oxide semiconductor is used for a semiconductor film. For example, even in an element with a channel width of $1 \times 10^6$ μm and a channel length of 10 μm, in a range from 1 V to 10 V of voltage (drain voltage) between a source terminal and a drain terminal, off-state current can be smaller than or equal to the measurement limit of a semiconductor parameter analyzer, that is, smaller than or equal to $1 \times 10^{-3}$ A. In this case, it can be found that an off-state current density corresponding to a value obtained by dividing the off-state current by the channel width of the transistor is less than or equal to 100 zA/μm. In addition, a capacitor and a transistor were connected to each other and an off-state current density was measured by using a circuit in which electric charge flowing into or from the capacitor was controlled by the transistor. In the measurement, the purified oxide semiconductor film was used for a channel formation region in the transistor, and the off-state current density of the transistor was measured from change in the amount of electric charge of the capacitor per unit time. As a result, it is found that, in the case where the voltage between the source terminal and the drain terminal of the transistor is 3 V, a smaller off-state current density of several tens of yoctoamperes per micrometer (yA/μm) can be obtained. Consequently, it can be said that a transistor whose channel formation region is formed in a purified oxide semiconductor film has much smaller off-state current than a transistor including silicon.

The oxide semiconductor preferably includes at least indium (In) or zinc (Zn). As a stabilizer for reducing variation in electric characteristics of a transistor including the oxide semiconductor, it is preferable that one or more selected from gallium (Ga), tin (Sn), hafnium (Hf), aluminum (Al), and zirconium (Zr) be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, it is possible to use indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with an In—Sn—Zn-based oxide, high mobility can be realized relatively easily. However, even with an In—Ga—Zn-based oxide, mobility can be increased by reducing the defect density in the bulk.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

In the case where the gate insulating films are formed using the same material, the amount of shift of the threshold voltage of the transistor can be controlled by the thickness ratio between the gate insulating films. When the thickness ratio of one of the gate insulating films to the other of the gate insulating films is 1:10, the amount of shift of the threshold voltage of the transistor tends to be high as compared to the case where the thickness ratio is 1:1.

It is preferable that hydrogen not be contained in the semiconductor film 533 before, during, and after the deposition. For example, it is preferable that hydrogen be contained as little as possible in the deposition of the semiconductor film 533 and that heat treatment for dehydration or dehydrogenation be performed after the deposition of the semiconductor film 533. Further, it is preferable that hydrogen be contained as little as possible in deposition of an insulating film in contact with the semiconductor film 533 and that heat treatment for dehydration or dehydrogenation be performed after the deposition of the insulating film.

When a film which prevents hydrogen from passing therethrough is used as the insulating film 531, hydrogen contained in the transistors in the lower portion, the insulating film 524, the interlayer insulating film 522, and the like can be prevented from reaching the semiconductor film 533. As the film which prevents hydrogen from passing therethrough, a silicon nitride film, a silicon oxynitride film, an aluminum oxide film, an aluminum oxynitride film, or the like is preferably used. In addition, when a film which prevents hydrogen from passing therethrough is used as the interlayer insulating film 537, hydrogen contained in the interlayer insulating film 538 can be prevented from reaching the semiconductor film 533.

Treatment for supplying oxygen to the semiconductor film 533 is preferably performed in order to reduce oxygen vacancies contained in the semiconductor film 533. For example, when an insulating film containing an excess amount of oxygen is provided in contact with the semiconductor film 533 and heat treatment is performed, oxygen can be supplied to the semiconductor film 533 from the insulating film containing an excess amount of oxygen. Oxygen is supplied to the semiconductor film 533, whereby oxygen vacancies contained in the semiconductor film 533 can be reduced. Treatment for adding oxygen to the semiconductor film 533 may be performed after the semiconductor film 533 is subjected to dehydration or dehydrogenation treatment. As the treatment for adding oxygen, an oxygen radical, ozone, an oxygen atom, an oxygen ion, or the like is added to the semiconductor film 533 by an ion implantation method, an ion doping method, plasma treatment, or the like, for example.

When the amount of impurities and oxygen vacancies in the semiconductor film 533 is reduced in this manner, generation of carriers can be suppressed. Suppressing the increase in carrier density can suppress negative shift of the threshold voltage of the transistor due to the carrier density. As a result, the threshold voltage of the transistor can be easily controlled by a potential applied to the other of the gate electrodes of the transistor.

This embodiment can be combined with any of the other embodiments as appropriate.

This application is based on Japanese Patent Application serial no. 2012-090058 filed with Japan Patent Office on Apr. 11, 2012, the entire contents of which are hereby incorporated by reference.

What is claimed is:

1. A semiconductor device comprising:
a differential circuit;
a bias circuit configured to supply a bias current to the differential circuit;
a reference voltage generation circuit configured to output a reference voltage to the bias circuit;
a switch configured to control supply of a power supply voltage to the reference voltage generation circuit; and
a holding circuit configured to hold the reference voltage, wherein the holding circuit comprises a first transistor and a capacitor, wherein the bias circuit comprises a second transistor,
wherein the first transistor comprises an oxide semiconductor film comprising a channel formation region,
wherein one of a source and a drain of the first transistor is electrically connected to the reference voltage generation circuit,
wherein the other of the source and the drain of the first transistor is electrically connected to the bias circuit,
wherein the capacitor is electrically connected to the other of the source and the drain of the first transistor,
wherein the first transistor is configured to be turned off while the differential circuit operates and a current flows in the second transistor, and
wherein the switch is configured to stop the supply of the power supply voltage to the reference voltage generation circuit while the differential circuit operates and the current flows in the second transistor.

2. The semiconductor device according to claim 1, wherein operating of the reference voltage generation circuit is stopped after the reference voltage is held in the holding circuit.

3. A semiconductor device comprising: a first transistor; a second transistor; a third transistor; a fourth transistor; a fifth transistor; a sixth transistor; a reference voltage generation circuit; a switch configured to control supply of a power supply voltage to the reference voltage generation circuit; and a capacitor, wherein a gate of the first transistor is electrically connected to a gate of the second transistor, wherein one of a source and a drain of the first transistor is electrically connected to one of a source and a drain of the third transistor, wherein one of a source and a drain of the second transistor is electrically connected to one of a source and a drain of the fourth transistor, wherein the other of the source and the drain of the third transistor is electrically connected to one of a source and a drain of the fifth transistor, wherein the other of the source and the drain of the fourth transistor is electrically connected to the one of the source and the drain of the fifth transistor, wherein one of a source and a drain of the sixth transistor is electrically connected to a gate of the fifth transistor, wherein the other of the source and the drain of the sixth transistor is electrically connected to the reference voltage generation circuit, wherein the capacitor is electrically connected to the gate of the fifth transistor, wherein the sixth transistor is configured to be turned off while a first supply voltage is supplied to the other of the source and the drain of the first transistor and a current flows in the fifth transistor, wherein the switch is configured to stop the supply of the power supply voltage to the reference voltage generation circuit while the current flows in the fifth transistor, wherein each of the first transistor, the second transistor, the third transistor and the fourth transistor comprises a channel formation region comprising silicon, and wherein the sixth transistor comprises an oxide semiconductor film comprising a channel formation region.

4. The semiconductor device according to claim 3, wherein the gate of the second transistor is electrically connected to the one of the source and the drain of the second transistor.

5. The semiconductor device according to claim 3, wherein the first power supply voltage is supplied to the other of the source and the drain of the second transistor, and
wherein a second power supply voltage is supplied to the other of the source and the drain of the fifth transistor.

6. The semiconductor device according to claim 3, wherein a reference voltage is supplied to the gate of the fifth transistor through the sixth transistor.

7. The semiconductor device according to claim 6, wherein the reference voltage generation circuit is configured to output the reference voltage.

8. The semiconductor device according to claim 7, wherein operating of the reference voltage generation circuit is stopped after the sixth transistor is turned off.

9. A semiconductor device comprising: a first transistor; a second transistor; a third transistor; a fourth transistor; a fifth transistor; a sixth transistor; a seventh transistor; a reference voltage generation circuit; a switch configured to control supply of a power supply voltage to the reference voltage generation circuit; a first capacitor; and a second capacitor, wherein a gate of the first transistor is electrically connected to a gate of the second transistor, wherein one of a source and a drain of the first transistor is electrically connected to one of a source and a drain of the third transistor, wherein one of a source and a drain of the second transistor is electrically connected to one of a source and a drain of the fourth transistor, wherein the other of the source and the drain of the third transistor is electrically connected to one of a source and a drain of the fifth transistor, wherein the other of the source and the drain of the fourth transistor is electrically connected to the one of the source and the drain of the fifth transistor, wherein one of a source and a drain of the sixth transistor is electrically connected to a gate of the fifth transistor, wherein the other of the source and the drain of the sixth transistor is electrically connected to the reference voltage generation circuit, wherein the first capacitor is electrically connected to the gate of the fifth transistor, wherein one of a source and a drain of the seventh transistor is electrically connected to a gate of the third transistor, wherein the other of the source and the drain of the seventh transistor is electrically connected to the reference voltage generation circuit, wherein the second capacitor is electrically connected to the gate of the third transistor, wherein the sixth transistor is configured to be turned off while a first power supply voltage is supplied to the other of the source and the drain of the first transistor and a current flows in the fifth transistor, wherein the switch is configured to stop the supply of the power supply voltage to the reference voltage generation circuit while the current flows in the fifth transistor, wherein each of the first transistor, the second transistor, the third transistor and the fourth transistor comprises a channel formation region comprising silicon, and wherein each of the sixth transistor and the seventh transistor comprises an oxide semiconductor film comprising a channel formation region.

10. The semiconductor device according to claim 9, wherein the gate of the second transistor is electrically connected to the one of the source and the drain of the second transistor.

11. The semiconductor device according to claim 9, wherein the first power supply voltage is supplied to the other of the source and the drain of the second transistor, and
wherein a second power supply voltage is supplied to the other of the source and the drain of the fifth transistor.

12. The semiconductor device according to claim 9, wherein a reference voltage is supplied to the gate of the fifth transistor through the sixth transistor.

13. The semiconductor device according to claim 12, wherein the reference voltage generation circuit is configured to output the reference voltage.

14. The semiconductor device according to claim 13, wherein operating of the reference voltage generation circuit is stopped after the sixth transistor is turned off.

* * * * *